(12) United States Patent
Ikeuchi

(10) Patent No.: US 9,608,596 B2
(45) Date of Patent: *Mar. 28, 2017

(54) ACOUSTIC WAVE DEVICE AND ANTENNA DUPLEXER INCLUDING SAME

(71) Applicant: SKYWORKS FILTER SOLUTIONS JAPAN CO., LTD., Kadoma-Shi (JP)

(72) Inventor: Satoru Ikeuchi, Hyogo-Ken (JP)

(73) Assignee: SKYWORKS FILTER SOLUTIONS JAPAN CO., LTD., Kadoma-Shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/181,801

(22) Filed: Jun. 14, 2016

(65) Prior Publication Data

US 2016/0294360 A1  Oct. 6, 2016

Related U.S. Application Data

(63) Continuation of application No. 14/220,847, filed on Mar. 20, 2014.

(30) Foreign Application Priority Data

Mar. 22, 2013 (JP) .................................. 2013-059520

(51) Int. Cl.
*H03H 9/46* (2006.01)
*H03H 9/64* (2006.01)
*H03H 9/72* (2006.01)

(52) U.S. Cl.
CPC ............ *H03H 9/64* (2013.01); *H03H 9/6456* (2013.01); *H03H 9/725* (2013.01); *H03H 9/6436* (2013.01)

(58) Field of Classification Search
CPC ................................. H03H 9/64; H03H 9/644
USPC ........................................ 333/133, 193, 195
See application file for complete search history.

(56) References Cited

U.S. PATENT DOCUMENTS

| 5,300,902 | A | 4/1994 | Satoh et al. |
| 5,666,091 | A | 9/1997 | Hikita et al. |
| 6,583,691 | B2 | 6/2003 | Takamine |
| 6,670,868 | B2 | 12/2003 | Kawase et al. |
| 6,762,657 | B2 | 7/2004 | Takamine |

(Continued)

FOREIGN PATENT DOCUMENTS

| JP | H05136651 A | 6/1993 |
| JP | H10270982 A | 10/1998 |
| JP | 2000349590 A | 12/2000 |

*Primary Examiner* — Dean Takaoka
(74) *Attorney, Agent, or Firm* — Lando & Anastasi, LLP

(57) ABSTRACT

An acoustic wave device includes a first longitudinally-coupled acoustic wave filter having interdigital transducer ("IDT") electrodes arranged in a propagation direction of acoustic wave, and a second longitudinally-coupled acoustic wave filter having IDT electrodes arranged in a propagation direction of acoustic wave. In the IDT electrodes of the first longitudinally-coupled acoustic wave filter, a comb-shaped electrode connected to an input port and another comb-shaped electrode connected to an output port are disposed in an in-phase relation. In the IDT electrodes of the second longitudinally-coupled acoustic wave filter, a comb-shaped electrode connected to an input port and another comb-shaped electrode connected to an output port are disposed in an anti-phase relation. This acoustic wave device has an excellent attenuation characteristic while maintaining a preferable insertion loss.

20 Claims, 10 Drawing Sheets

(56) References Cited

U.S. PATENT DOCUMENTS

| | | | |
|---|---|---|---|
| 9,407,237 B2* | 8/2016 | Ikeuchi | ............... H03H 9/6456 |
| 2010/0219912 A1 | 9/2010 | Tanaka et al. | |
| 2014/0354373 A1 | 12/2014 | Ikeuchi | |

* cited by examiner

ACOUSTIC WAVE DEVICE AND ANTENNA DUPLEXER INCLUDING SAME

RELATED APPLICATIONS

This application claims the benefit under 35 U.S.C. §120 as a continuation of U.S. application Ser. No. 14/220,847, titled "ACOUSTIC WAVE DEVICE AND ANTENNA DUPLEXER INCLUDING SAME," filed on Mar. 20, 2014, which is herein incorporated by reference in its entirety. U.S. application Ser. No. 14/220,847 claims the benefit of Japanese Application No. 2013-059520, filed on Mar. 22, 2013.

TECHNICAL FIELD

The present invention relates to an acoustic wave device used for a filter and an antenna duplexer of a telecommunications apparatus and the like.

BACKGROUND ART

In Band 13 and Band 20 specified in the communications standard of Universal Mobile Telecommunications System ("UMTS"), downlink frequencies are set lower than uplink frequencies. There are cases where a sufficient amount of attenuation cannot be secured in a transmitting frequency band when a reception filter of an antenna duplexer corresponding to such a communications standard is constructed of a longitudinally-coupled acoustic wave filter.

FIG. 8 is a schematic diagram of conventional acoustic wave device 900A contrived to improve an attenuation characteristic of a longitudinally-coupled acoustic wave filter, as described in Japanese Patent Laid-Open Publication, No. 1993-136651. Acoustic wave device 900A includes longitudinally-coupled acoustic wave filters 901A, 902A and 903A that are connected in series. Acoustic wave device 900A has a large insertion loss in the pass band, and hence, is not preferable as a receiving filter of an antenna duplexer.

FIG. 9 is a schematic diagram of another conventional acoustic wave device 900B disclosed in Japanese Patent Laid-Open Publication, No. 1998-270982. Acoustic wave device 900B includes two longitudinally-coupled acoustic wave filters 901B and 902B connected via one-port resonator 903B. FIG. 10 is a schematic diagram of still another conventional acoustic wave device 900C disclosed in Japanese Patent Laid-Open Publication, No. 2000-349590. Acoustic wave device 900C includes two longitudinally-coupled acoustic wave filters 901C and 902C connected via two one-port resonators 903C and 904C having different anti-resonance frequencies. It is not possible to obtain a sufficient amount of attenuation for any of acoustic wave devices 900B and 900C in which two longitudinally-coupled acoustic wave filters are connected simply via one-port resonators.

SUMMARY

An acoustic wave device includes a first longitudinally-coupled acoustic wave filter having interdigital transducer ("IDT") electrodes arranged in a propagation direction of acoustic wave, and a second longitudinally-coupled acoustic wave filter having IDT electrodes arranged in a propagation direction of acoustic wave. In the IDT electrodes of the first longitudinally-coupled acoustic wave filter, a comb-shaped electrode connected to an input port and another comb-shaped electrode connected to an output port are disposed in an in-phase relation. In the IDT electrodes of the second longitudinally-coupled acoustic wave filter, a comb-shaped electrode connected to an input port and another comb-shaped electrode connected to an output port are disposed in an anti-phase relation.

This acoustic wave device has an excellent attenuation characteristic while maintaining a preferable insertion loss.

DETAIL DESCRIPTION OF PREFERRED EMBODIMENTS

Exemplary Embodiment 1

Figure 1:
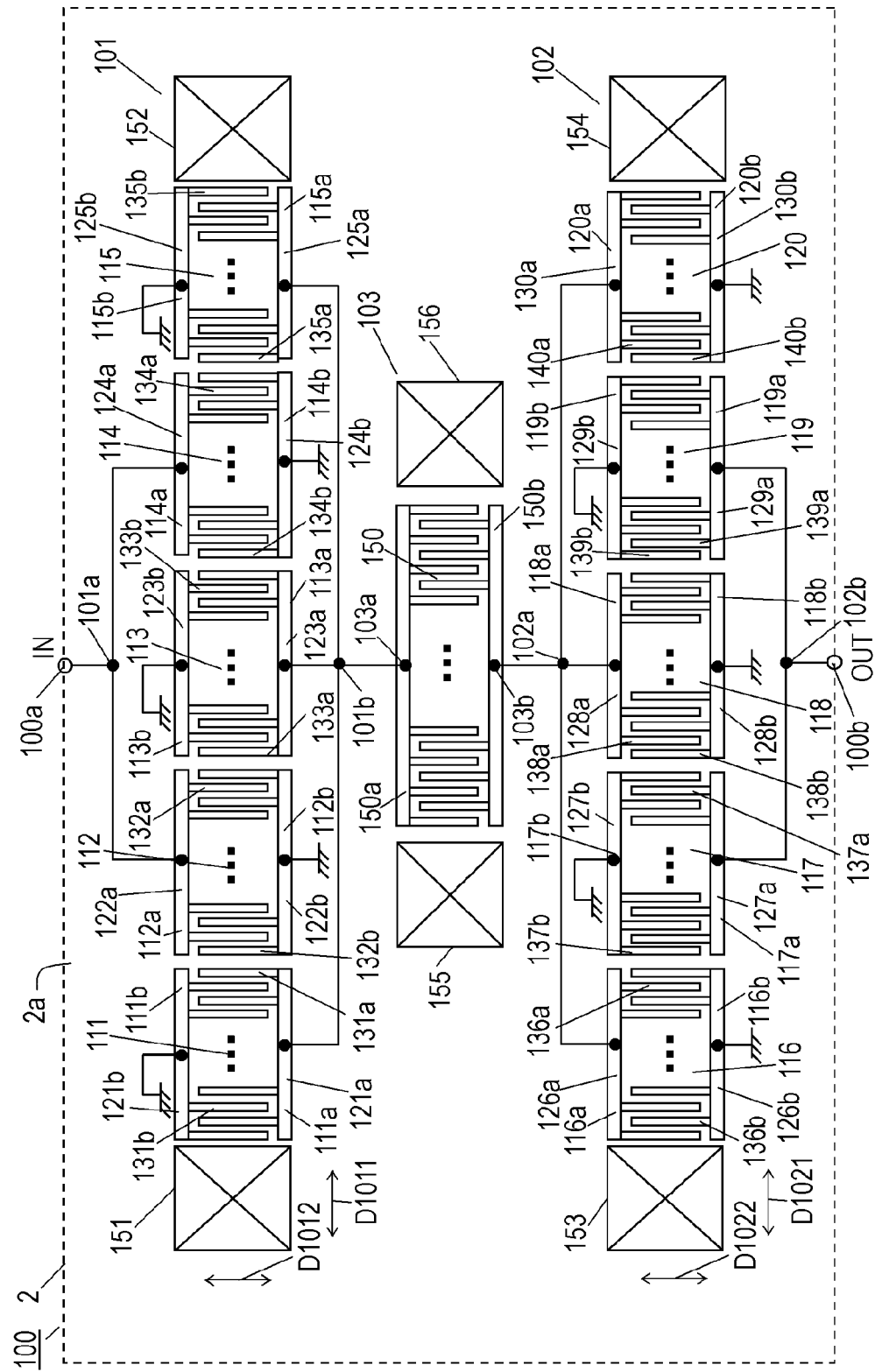
FIG. 1 is a schematic diagram of an acoustic wave device according to Exemplary Embodiment 1 of the present invention.

FIG. 1 is a schematic diagram of acoustic wave device 100 according to Exemplary Embodiment 1 of the present invention. Acoustic wave device 100 includes input terminal 100a, output terminal 100b, longitudinally-coupled acoustic wave filter 101 connected to input terminal 100a, and longitudinally-coupled acoustic wave filter 102 connected to output terminal 100b. Longitudinally-coupled acoustic wave filters 101 and 102 are disposed on surface 2a of piezoelectric substrate 2 made of a piezoelectric material, such as lithium niobate or lithium tantalate, that are capable of propagating acoustic waves such as Rayleigh waves and shear horizontal ("SH") waves.

Longitudinally-coupled acoustic wave filter 101 includes input port 101a connected to input terminal 100a, output port 101b, reflectors 151 and 152, and five interdigital transducer ("IDT") electrodes 111, 112, 113, 114 and 115 which are disposed between reflectors 151 and 152. Acoustic wave excited by at least one of IDT electrodes 111 to 115 propagates through IDT electrodes 111 to 115 between reflectors 151 and 152 in propagation direction D1011. IDT electrodes 111, 112, 113, 114 and 115 are arranged in this order in propagation direction D1011. IDT electrode 111 has comb-shaped electrodes 111a and 111b that face each other and interdigitate with each other. Comb-shaped electrode 111a includes bus bar 121a extending in propagation direction D1011 and electrode fingers 131a extending in direction D1012 perpendicular to propagation direction D1011 from bus bar 121a toward bus bar 121b of comb-shaped electrode 111b. Comb-shaped electrode 111b includes bus bar 121b extending in propagation direction D1011 and electrode fingers 131b extending in direction D1012 from bus bar 121b toward bus bar 121a of comb-shaped electrode 111a. Electrode fingers 131a and electrode fingers 131b are alternately arranged at predetermined pitches in propagation direction D1011. IDT electrode 112 has comb-shaped electrodes 112a and 112b that face each other and interdigitate with each other. Comb-shaped electrode 112a includes bus bar 122a extending in propagation direction D1011 and electrode fingers 132a extending in direction D1012 from bus bar 122a toward bus bar 122b of comb-shaped electrode 112b. Comb-shaped electrode 112b includes bus bar 122b extending in propagation direction D1011 and electrode fingers 132b extending in direction D1012 from bus bar 122b toward bus bar 122a of comb-shaped electrode 112a. Electrode fingers 132a and electrode fingers 132b are alternately arranged at the above predetermined pitches in propagation direction D1011. IDT electrode 113 has comb-shaped electrodes 113a and 113b that face each other and interdigitate with each other. Comb-shaped electrode 113a includes bus bar 123a extending in propagation direction D1011 and electrode fingers 133a extending in direction D1012 from bus bar 123a toward bus bar 123b of comb-shaped electrode 113b. Comb-shaped electrode 113b includes bus bar 123b extending in propagation direction D1011 and electrode fingers 133b extending in direction D1012 from bus bar 123b toward bus bar 123a of comb-shaped electrode 113a. Electrode fingers 133a and electrode fingers 133b are alternately arranged at the above predetermined pitches in propagation direction D1011. IDT electrode 114 has comb-shaped electrodes 114a and 114b that face each other and interdigitate with each other. Comb-shaped electrode 114a includes bus bar 124a extending in propagation direction D1011 and electrode fingers 134a extending in direction D1012 from bus bar 124a toward bus bar 124b of comb-shaped electrode 114b. Comb-shaped electrode 114b includes bus bar 124b extending in propagation direction D1011 and electrode fingers 134b extending in direction D1012 from bus bar 124b toward bus bar 124a of comb-shaped electrode 114a. Electrode fingers 134a and electrode fingers 134b are alternately arranged at the above predetermined pitches in propagation direction D1011. IDT electrode 115 has comb-shaped electrodes 115a and 115b that face each other and interdigitate with each other. Comb-shaped electrode 115a includes bus bar 125a extending in propagation direction D1011 and electrode fingers 135a extending in direction D1012 from bus bar 125a toward bus bar 125b of comb-shaped electrode 115b. Comb-shaped electrode 115b includes bus bar 125b extending in propagation direction D1011 and electrode fingers 135b extending in direction D1012 from bus bar 125b toward bus bar 125a of comb-shaped electrode 115a. Electrode fingers 135a and electrode fingers 135b are alternately arranged at the above predetermined pitches in propagation direction D1011. Each of the above pitches is equal to a distance between centers of two electrode fingers adjacent to each other in propagation direction D1011, and is a half of a wavelength of the acoustic wave that propagates through IDT electrodes 111 to 115. Comb-shaped electrode 112a of IDT electrode 112 and comb-shaped electrode 114a of IDT electrode 114 are connected to input port 101a. Comb-shaped electrode 112b of IDT electrode 112 and comb-shaped electrode 114b of IDT electrode 114 are grounded. Comb-shaped electrode 111a of IDT electrode 111, comb-shaped electrode 113a of IDT electrode 113 and comb-shaped electrode 115a of IDT electrode 115 are connected to output port 101b. Comb-shaped electrode 111b of IDT electrode 111, comb-shaped electrode 113b of IDT electrode 113 and comb-shaped electrode 115b of IDT electrode 115 are grounded. Comb-shaped electrodes of IDT electrodes out of IDT electrodes 111 to 115 arranged adjacent to each other are arranged such that the comb-shaped electrodes are arranged in relation of same phase (i.e., in an in-phase relation).

Figure 2A:
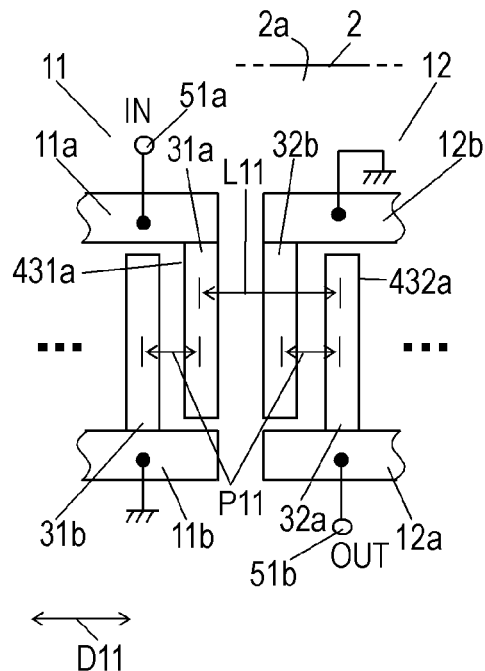
FIGS. 2A to 2D are enlarged views of comb-shaped electrodes of another acoustic wave device according to Embodiment 1.
Figure 2B:
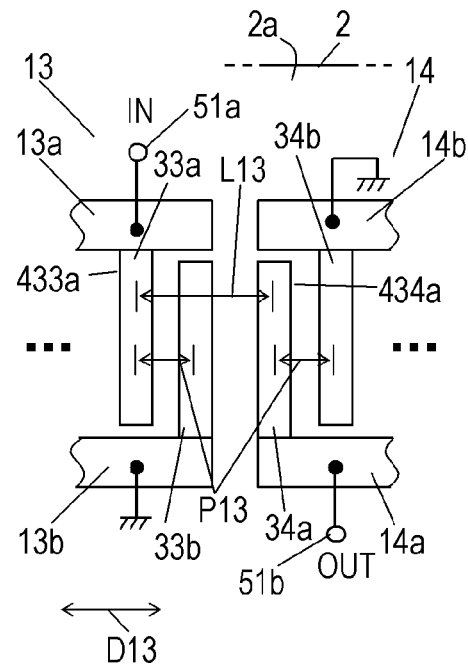

Phase relations between comb-shaped electrodes of IDT electrodes adjacent to each other will be described below. FIGS. 2A to 2D are enlarged views of an IDT electrode connected to input port 51a, and another IDT electrode connected to output port 51b. In FIGS. 2A and 2B, the IDT electrodes are arranged in an in-phase relation.

In FIG. 2A, IDT electrodes 11 and 12 adjacent to each other are disposed on surface 2a of piezoelectric substrate 2. Comb-shaped electrode 11a of IDT electrode 11 is connected to input port 51a while comb-shaped electrode 11b of IDT electrode 11 is grounded. Similarly, comb-shaped electrode 12a of IDT electrode 12 is connected to output port 51b while comb-shaped electrode 12b of IDT electrode 12 is grounded. Input port 51a and output port 51b are hot terminals having electrical potentials change. Comb-shaped electrode 11a connected to input port 51a and comb-shaped electrode 12a connected to output port 51b are hot comb-shaped electrodes having electrical potentials change. Grounded comb-shaped electrodes 11b and 12b are cold comb-shaped electrodes having electrical potentials not change. An acoustic wave excited by IDT electrode 11 with a signal supplied from input port 51a propagates through IDT electrodes 11 and 12 in propagation direction D11. Electrode fingers 31a of comb-shaped electrode 11a of IDT electrode 11 are arranged alternately with electrode fingers 31b of comb-shaped electrode 11b at predetermined pitches P11 in propagation direction D11. Pitch P11 is a distance in propagation direction D11 between centers of electrode fingers out of electrode fingers 31a and 31b adjacent to each other, and is half a wavelength of the acoustic wave. Electrode fingers 32a of comb-shaped electrode 12a of IDT electrode 12 where the acoustic wave excited by IDT electrode 11 propagates through are arranged alternately with electrode fingers 32b of comb-shaped electrode 12b at predetermined pitches P11 in propagation direction D11. Pitch P11 is a distance in propagation direction D11 between centers of electrode fingers out of electrode fingers 32a and 32b in propagation direction D11. The distance between the centers of the electrode fingers out of electrode fingers 31a of comb-shaped electrode 11a adjacent to each other in propagation direction D 11 is equal to the wavelength of the acoustic wave, and is twice the pitch P11 in propagation direction D11. A distance in propagation direction D11 between the centers of the electrode fingers out of electrode fingers 31b of comb-shaped electrode 11b adjacent to each other in propagation direction D11 is equal to the wavelength of the acoustic wave, and is twice the pitch P11. Similarly, a distance in propagation direction D11 between the centers of electrode fingers out of electrode fingers 32a of comb-shaped electrode 12a adjacent to each other in propagation direction D11 is equal to the wavelength of the acoustic wave which is twice the pitch P11 in propagation direction D11. A distance in propagation direction D11 between the centers of the electrode fingers out of electrode fingers 32b of comb-shaped electrode 12b adjacent to each other in propagation direction 15 D11 is equal to the wavelength of the acoustic wave which is twice the pitch P11. Distance L11 in propagation direction D11 between the center of any one electrode finger 31a out of electrode fingers 31a of comb-shaped electrode 11a of IDT electrode 11 connected to input port 51a, i.e., a hot terminal, and the center of any one electrode finger 32a out of electrode fingers 32a of comb-shaped electrode 12a of IDT electrode 12 connected to output port 51b, i.e., a hot terminal, is an integer multiple of the wavelength of the acoustic wave. That is, distance L11 in propagation direction D11 between the center of one electrode finger 31a out of electrode fingers 31a of comb-shaped electrode 11a of IDT electrode 11 connected to input port 51a, or the hot terminal, and the center of one electrode finger 32a out of electrode fingers 32a of comb-shaped electrode 12a of IDT electrode 12 connected to output port 51b, or a hot terminal, is an integer multiple of the wavelength of the acoustic wave. In this structure, when a stress exerted by the acoustic wave on portion 431a of piezoelectric substrate 2 on which electrode finger 31a is located is the largest, a stress exerted on portion 432a of piezoelectric substrate 2 on which electrode finger 32a is located becomes largest in the same direction as the stress exerted on portion 431a of piezoelectric substrate 2. In other words, when a crest out of a series of crests and troughs of the acoustic wave appears on electrode finger 31a, another crest of the acoustic wave appears on electrode finger 32a. As a result, a signal having the same phase as the signal supplied to input port 51a is output from output port 51b. The arrangement described here is defined that a phase relation between the comb-shaped electrodes of the IDT electrodes adjacent to each other is an in-phase relation. In the case that the phase relation between the comb-shaped electrodes of the IDT electrodes adjacent to each other is in the in-phase relation, and the case that electrode fingers 31a, 31b, 32a, and 32b of IDT electrodes 11 and 12 are arranged entirely at pitches P11 in propagation direction D11, only one grounded electrode finger 32b is located between one electrode finger 31a closest to IDT electrode 12 among electrode fingers 31a of comb-shaped electrode 11a of IDT electrode 11 connected to input port 51a and one electrode finger 32a closest to IDT electrode 11 among electrode fingers 32a of comb-shaped electrode 12a of IDT electrode 12 connected to output port 51b.

In FIG. 2B, IDT electrodes 13 and 14 that are adjacent to each other are disposed on surface 2a of piezoelectric substrate 2. Comb-shaped electrode 13a of IDT electrode 13 is connected to input port 51a while comb-shaped electrode 13b of IDT electrode 13 is grounded. Similarly, comb-shaped electrode 14a of IDT electrode 14 is connected to output port 51b while comb-shaped electrode 14b of IDT electrode 14 is grounded. Input port 51a is a hot terminal having an electrical potential change, so that comb-shaped electrode 13a connected to input port 51a and comb-shaped electrode 14a connected to output port 51b are hot comb-shaped electrodes of having electrical potentials change. Grounded comb-shaped electrodes 13b and 14b are cold comb-shaped electrodes having electrical potentials not change. Acoustic wave excited by IDT electrode 13 with a signal supplied from input port 51a propagates through IDT electrodes 13 and 14 in propagation direction D13. Electrode fingers 33a of comb-shaped electrode 13a of IDT electrode 13 are arranged alternately with electrode fingers 33b of comb-shaped electrode 13b at predetermined pitches P13 in propagation direction D13. Pitch P13 is a distance in propagation direction D13 between centers of two electrode fingers out of electrode fingers 33a and 33b adjacent to each other, and is a half of a wavelength of the acoustic wave. Electrode fingers 34a of comb-shaped electrode 14a of IDT electrode 14 where the acoustic wave excited by IDT electrode 13 propagates through are arranged alternately with electrode fingers 34b of comb-shaped electrode 14b at predetermined pitches P13 in propagation direction D13. Pitch P13 is a distance in propagation direction D13 between centers of electrode fingers out of electrode fingers 34a and 34b adjacent to each other in propagation direction D13. A distance in propagation direction D 13 between the centers of the electrode fingers out of electrode fingers 33a of comb-shaped electrode 13a adjacent to each other is equal to the wavelength of the acoustic wave, and is twice the pitch P13 in propagation direction D13. A distance in propagation direction D13 between the centers of the electrode fingers out of electrode fingers 33b of comb-shaped electrode 13b adjacent to each other is equal to the wavelength of the acoustic wave, and is twice the pitch P13. Similarly, a distance in propagation direction D13 between the centers of electrode fingers out of electrode fingers 34a of comb-shaped electrode 14a adjacent to each other is equal to the wavelength of the acoustic wave, and is twice the pitch P13 in propagation direction D13. The distance in propagation direction D13 between the centers of electrode fingers out of electrode fingers 34b of comb-shaped electrode 14b adjacent to each other is equal to the wavelength of the acoustic wave, and is twice the pitch P13. Distance L13 in propagation direction D13 between the center of any one electrode finger 33a out of electrode fingers 33a of comb-shaped electrode 13a of IDT electrode 13 connected to input port 51a, i.e., the hot terminal, and the center of any one electrode finger 34a out of electrode fingers 34a of comb-shaped electrode 14a of IDT electrode 14 connected to output port 51b, i.e., a hot terminal, is an integer multiple of the wavelength of the acoustic wave. That is, distance L13 in propagation direction D13 between the center of one electrode finger 33a out of electrode fingers 33a of comb-shaped electrode 13a of IDT electrode 13 connected to input port 51a, or the hot terminal, and the center of one electrode finger 34a out of electrode fingers 34a of comb-shaped electrode 14a of IDT electrode 14 connected to output port 51b, or a hot terminal, is an integer multiple of the wavelength of the acoustic wave. In this structure, when a stress exerted by the acoustic wave on portion 433a of piezoelectric substrate 2 on which electrode finger 33a is located is the largest, a stress exerted on portion 434a of piezoelectric substrate 2 on which electrode finger 34a is located becomes largest in the same direction as the stress exerted on portion 433a of piezoelectric substrate 2. In other words, when a crest out of a series of crests and troughs of the acoustic wave appears on electrode finger 33a, another crest of the acoustic wave appears on electrode finger 34a. As a result, a signal having the same phase as the signal supplied to input port 51a is output to output port 51b. The arrangement described here is defined that a phase relation between the comb-shaped electrodes of the IDT electrodes adjacent to each other is an in-phase relation. In the case that the phase relation between the comb-shaped electrodes of the adjoining IDT electrodes is an in-phase relation, and that electrode fingers 33a, 33b, 34a, and 34b of IDT electrodes 13 and 14 are arranged entirely at pitches P13 in propagation direction D 13, only one grounded electrode finger 33b is located between one electrode finger 33a closest to IDT electrode 14 among electrode fingers 33a of comb-shaped electrode 13a of IDT electrode 13 connected to input port 51a and one electrode finger 34b closest to IDT electrode 13 among electrode fingers 34a of comb-shaped electrode 14a of IDT electrode 14 connected to output port 51b. The arrangement in which the number of grounded electrode fingers that are located between the electrode fingers closest to each other connected to the hot terminals is an odd number allows a phase relation between the comb-shaped electrodes of the IDT electrodes adjacent to each other to be an in-phase relation.

Figure 2C:
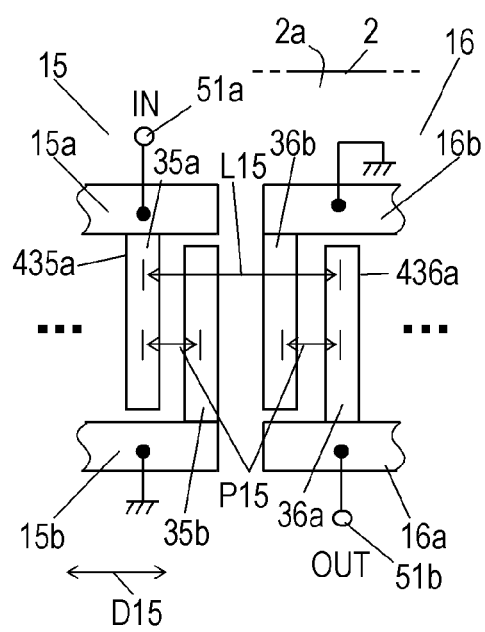
Figure 2D:
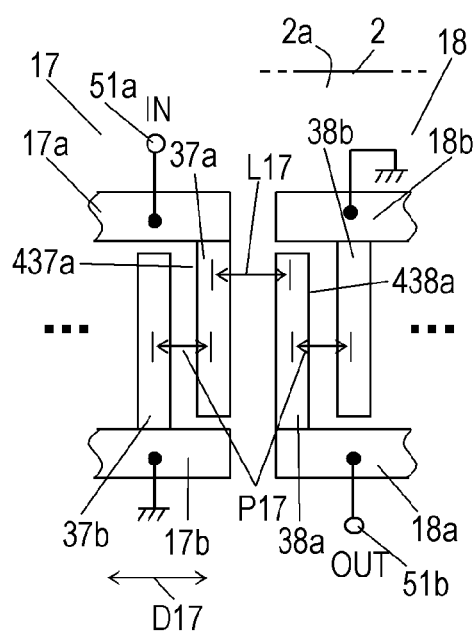

IDT electrodes shown in FIGS. 2C and 2D are arranged in a relation of opposite phase, i.e., anti-phase relation.

In FIG. 2C, IDT electrodes 15 and 16 adjacent to each other are disposed on surface 2a of piezoelectric substrate 2. Comb-shaped electrode 15a of IDT electrode 15 is connected to input port 51a while comb-shaped electrode 15b is grounded. Similarly, comb-shaped electrode 16a of IDT electrode 16 is connected to output port 51b while comb-shaped electrode 16b is grounded. Input port 51a and output port 51b are hot terminals having electrical potentials change. Comb-shaped electrode 15a connected to input port 51a and comb-shaped electrode 16a connected to output port 51b are hot comb-shaped electrodes having electrical potentials change. Grounded comb-shaped electrodes 15b and 16b are cold comb-shaped electrodes having electrical potentials not change. An acoustic wave excited by IDT electrode 15 with a signal supplied from input port 51a propagates through IDT electrodes 15 and 16 in propagation direction D15. Electrode fingers 35a of comb-shaped electrode 15a of IDT electrode 15 are arranged alternately with electrode fingers 35b of comb-shaped electrode 15b at predetermined pitches P15 in propagation direction D15. Pitch P15 is a distance in propagation direction D15 between centers of electrode fingers out of electrode fingers 35a and 35b adjacent to each other, and is a half of a wavelength of the acoustic wave. Electrode fingers 36a of comb-shaped electrode 16a of IDT electrode 16 where the acoustic wave excited by IDT electrode 15 propagates through are arranged alternately with electrode fingers 36b of comb-shaped electrode 16b at predetermined pitches P15 in propagation direction D15. Pitch P15 is a distance in propagation direction D15 between centers of electrode fingers out of electrode fingers 36a and 36b adjacent to each other in propagation direction D15. A distance in propagation direction D15 between the centers of electrode fingers out of electrode fingers 35a of comb-shaped electrode 15a is equal to the wavelength of the acoustic wave, and is twice the pitch P15. A distance in propagation direction D15 between the centers of electrode fingers out of electrode fingers 35b of comb-shaped electrode 15b adjacent to each other is equal to the wavelength of the acoustic wave, and is twice the pitch P15. Similarly, a distance in propagation direction D15 between the centers of electrode fingers out of electrode fingers 36a of comb-shaped electrode 16a adjacent to each other is equal to the wavelength of the acoustic wave, and is twice the pitch P15. A distance in propagation direction D 15 between the centers of electrode fingers out of electrode fingers 36b of comb-shaped electrode 16b adjacent to each other is equal to the wavelength of the acoustic wave, and is twice the pitch P15. Distance L15 in propagation direction D15 between the center of any one electrode finger 35a out of electrode fingers 35a of comb-shaped electrode 15a of IDT electrode 15 connected to input port 51a, i.e., the hot terminal, and the center of any one electrode finger 36a out of electrode fingers 36a of comb-shaped electrode 16a of IDT electrode 16 connected to output port 51b, i.e., a hot terminal, is equal to the sum of an integer multiple of the wavelength of the acoustic wave and a half of the wavelength. Distance L15 in propagation direction D15 between the center of one electrode finger 35a out of electrode fingers 35a of comb-shaped electrode 15a of IDT electrode 15 connected to input port 51a, i.e., the hot terminal, and the center of one electrode finger 16a out of electrode fingers 36a of comb-shaped electrode 16a of IDT electrode 16 connected to output port 51b, i.e., a hot terminal, is equal to the sum of an integer multiple of the wavelength of the acoustic wave and a half of the wavelength. In this structure, when a stress exerted by the acoustic wave on portion 435a of piezoelectric substrate 2 on which electrode finger 35a is located is the largest, a stress exerted on portion 436a of piezoelectric substrate 2 on which electrode finger 36a is located becomes largest in a direction opposite to that of the stress exerted on portion 435a of piezoelectric substrate 2. In other words, when a crest out of a series of crests and troughs of the acoustic wave appears on electrode finger 35a, a trough of the acoustic wave appears on electrode finger 36a. As a result, a signal having a phase opposite to that of the signal supplied to input port 51a is output to output port 51b. The arrangement described here is defined that a phase relation between the comb-shaped electrodes of IDT electrodes adjacent to each other is an anti-phase relation. In this case that the phase relation between the comb-shaped electrodes of the IDT electrodes adjacent to each other is an anti-phase relation and that electrode fingers 35a, 35b, 36a and 36b of IDT electrodes 15 and 16 are arranged entirely at pitches P15 in propagation direction D15, two grounded electrode fingers 35b and 36b in total, i.e., one grounded electrode finger 35b and one grounded electrode finger 36b are located between one electrode finger 35a closest to IDT electrode 16 among electrode fingers 35a of comb-shaped electrode 15a of IDT electrode 15 connected to input port 51a and one electrode finger 36a closest to IDT electrode 15 among electrode fingers 36a of comb-shaped electrode 16a of IDT electrode 16 connected to output port 51b.

In FIG. 2D, IDT electrodes 17 and 18 adjacent to each other are disposed on surface 2a of piezoelectric substrate 2. Comb-shaped electrode 17a of IDT electrode 17 is connected to input port 51a while comb-shaped electrode 17b is grounded. Similarly, comb-shaped electrode 18a of IDT electrode 18 is connected to output port 51b while comb-shaped electrode 18b is grounded. Input port 51a and output port 51b are hot terminals having electrical potentials change. Comb-shaped electrode 17a connected to input port 51a and comb-shaped electrode 18a connected to output port 51b are hot comb-shaped electrodes having electrical potentials change. Grounded comb-shaped electrodes 17b and 18b are cold comb-shaped electrodes having electrical potentials not change. An acoustic wave excited by IDT electrode 17 with a signal supplied from input port 51a propagates through IDT electrodes 17 and 18 in propagation direction D17. Electrode fingers 37a of comb-shaped electrode 17a of IDT electrode 17 are arranged alternately with electrode fingers 37b of comb-shaped electrode 17b at predetermined pitches P17 in propagation direction D17. Pitch P17 is a distance between centers of electrode fingers out of electrode fingers 37a and 37b adjacent to each other, and is a half of a wavelength of the acoustic wave. Electrode fingers 38a of comb-shaped electrode 18a of IDT electrode 18 where the acoustic wave excited by IDT electrode 17 propagates through are arranged alternately with electrode fingers 38b of comb-shaped electrode 18b at predetermined pitches P17 in propagation direction D17. Pitch P17 is a distance in propagation direction D17 between centers of electrode fingers out of electrode fingers 38a and 38b adjacent to each other in propagation direction D17. A distance in propagation direction D17 between the centers of electrode fingers out of electrode fingers 37a of comb-shaped electrode 17a adjacent to each other is equal to the wavelength of the acoustic wave, and is twice the pitch P17. A distance in propagation direction D17 between the centers of electrode fingers out of electrode fingers 37b of comb-shaped electrode 17b adjacent to each other is also equal to the wavelength of the acoustic wave, and is twice the pitch P17. Similarly, a distance in propagation direction D17 between the centers of electrode fingers out of electrode fingers 38a of comb-shaped electrode 18a adjacent to each other is equal to the wavelength of the acoustic wave, and is twice the pitch P17. A distance in propagation direction D17 between the centers of electrode fingers out of electrode fingers 38b of comb-shaped electrode 18b adjacent to each other is also equal to the wavelength of the acoustic wave, and is twice the interval P17. Distance L17 in propagation direction D17 between the center of any one electrode finger 37a out of electrode fingers 37a of comb-shaped electrode 17a of IDT electrode 17 connected to input port 51a, i.e., the hot terminal, and the center of any one electrode finger 38a out of electrode fingers 38a of comb-shaped electrode 18a of IDT electrode 18 connected to output port 51b, i.e., a hot terminal, is equal to the sum of an integer multiple of the wavelength of the acoustic wave and a half of the wavelength. That is, distance L17 in propagation direction D17 between the center of one electrode finger 37a out of electrode fingers 37a of comb-shaped electrode 17a of IDT electrode 17 connected to input port 51a, i.e., the hot terminal, and the center of one electrode finger 38a out of electrode fingers 38a of comb-shaped electrode 18a of IDT electrode 18 connected to output port 51b, i.e., a hot terminal, is equal to the sum of an integer multiple of the wavelength of the acoustic wave and a half of the wavelength. It this structure, when a stress exerted by the acoustic wave on portion 437a of piezoelectric substrate 2 on which electrode finger 37a is located is the largest, a stress exerted on portion 438a of piezoelectric substrate 2 on which electrode finger 38a is located becomes largest in a direction opposite to that of the stress exerted on portion 435a of piezoelectric substrate 2. In other words, when a crest out of a series of crests and troughs of the acoustic wave appears on electrode finger 37a, a trough of the acoustic wave appears on electrode finger 38a. As a result, a signal having a phase opposite phase to that of the signal supplied to input port 51a is output to output port 51b. The arrangement described here is defined that a phase relation between comb-shaped electrodes of IDT electrodes adjacent to each other is an anti-phase relation. In this case that the phase relation between the comb-shaped electrodes of the IDT electrodes adjacent to each other is an anti-phase relation and that electrode fingers 37a, 37b, 38a and 38b of IDT electrodes 17 and 18 are arranged entirely at pitches P17 in propagation direction D17, no grounded electrode finger is located between one electrode finger 37a closest to IDT electrode 18 among electrode fingers 37a of comb-shaped electrode 17a of IDT electrode 17 connected to input port 51a and one electrode finger 38a closest to IDT electrode 17 among electrode fingers 38a of comb-shaped electrode 19a of IDT electrode 18 connected to output port 51b. That is, the number of grounded electrode fingers that are located between one electrode finger 37a closest to IDT electrode 18 among electrode fingers 37a of comb-shaped electrode 17a of IDT electrode 17 connected to input port 51a and one electrode finger 38a closest to IDT electrode 17 among electrode fingers 38a of comb-shaped electrode 19a of IDT electrode 18 connected to output port 51b is zero. The arrangement in which the number of grounded electrode fingers that are located between the closest electrode fingers connected to the hot terminals is zero or an even number allows a phase relation between the comb-shaped electrodes of the IDT electrodes adjacent to each other to become the anti-phase relation.

The structure of longitudinally-coupled acoustic wave filter 101 shown in FIG. 1 will be described below. One of grounded electrode fingers 132b is located between the electrode fingers closest to each other among comb-shaped electrode 112a of IDT electrode 112 connected to input port 101a and comb-shaped electrode 111a of IDT electrode 111 connected to output port 101b. Regarding all of the relations between IDT electrodes 112 and 113, between IDT electrodes 114 113, and between IDT electrodes 114 and 115, one grounded electrode finger is located between two electrode fingers that are connected to the hot terminals and are closest to each other, and a phase relation between the comb-shaped electrodes of the adjoining IDT electrodes is an in-phase relation, similarly to IDT electrodes 11 to 14 shown in FIGS. 2A and 2B.

In propagation direction D1011, a distance between a center of one or any one electrode finger 131a out of electrode fingers 131a of IDT electrode 111 and a center of one or any one electrode finger 132a out of electrode fingers 132a of IDT electrode 112 adjacent to IDT electrode 111 is equal to an integer multiple of the wavelength of the acoustic wave that propagates through IDT electrodes 111 to 115. A distance in propagation direction D1011 between a center of one or any one electrode finger 132a out of electrode fingers 132a of IDT electrode 112 and a center of one or any one electrode finger 133a out of electrode fingers 133a of IDT electrode 113 adjacent to IDT electrode 112 is equal to an integer multiple of the wavelength of the acoustic wave that propagates through IDT electrodes 111 to 115. A distance in propagation direction D1011 between a center of one or any other electrode finger 133a out of electrode fingers 133a of IDT electrode 113 and a center of one or any other electrode finger 134a out of electrode fingers 134a of IDT electrode 114 adjacent to IDT electrode 113 is equal to an integer multiple of the wavelength of the acoustic wave that propagates through IDT electrodes 111 to 115. A distance in propagation direction D1011 between a center of one or any one electrode finger 134a out of electrode fingers 134a of IDT electrode 114 and a center of one or any one electrode finger 135a out of electrode fingers 135a of IDT electrode 115 adjacent to IDT electrode 114 is equal to an integer multiple of the wavelength of the acoustic wave that propagates through IDT electrodes 111 to 115.

In the case that the electrode fingers of IDT electrodes 111 to 115 are arranged entirely at the above pitches in propagation direction D1011, the number of electrode fingers out of electrode fingers 131b and 132b of IDT electrodes 111 and 112 adjacent to each other in propagation direction D1011 that are located between electrode finger 131a closest to comb-shaped electrode 112a among electrode fingers 131a and electrode finger 132a closest to comb-shaped electrode 111a among electrode fingers 132a is an odd number. In this case, the number of electrode fingers out of electrode fingers 132b and 133b of IDT electrodes 112 and 113 adjacent to each other in propagation direction D1011 that are located between electrode finger 132a closest to comb-shaped electrode 113a among electrode fingers 132a and electrode finger 133a closest to comb-shaped electrode 112a among electrode fingers 133a is an odd number. In this case, the number of electrode fingers out of electrode fingers 133b and 134b of IDT electrodes 113 and 114 adjacent to each other in propagation direction D1011 that are located between electrode finger 133a closest to comb-shaped electrode 114a among electrode fingers 133a and electrode finger 134a closest to comb-shaped electrode 113a among electrode fingers 134a is an odd number. In this case, the number of electrode fingers out of electrode fingers 134b and 135b of IDT electrodes 114 and 115 adjacent to each other in propagation direction D1011 that are located between electrode finger 134a closest to comb-shaped electrode 115a among electrode fingers 134a and electrode finger 135a closest to comb-shaped electrode 114a among electrode fingers 135a is an odd number.

Longitudinally-coupled acoustic wave filter 102 includes input port 102a, output port 102b connected to output terminal 100b, reflectors 153 and 154, and five IDT electrodes 116, 117, 118, 119, and 120 disposed between reflectors 153 and 154. Acoustic wave excited by at least one of IDT electrodes 116 to 120 propagates through IDT electrodes 116 to 120 between reflectors 153 and 154 in propagation direction D1021. IDT electrodes 116, 117, 118, 119, and 120 are arranged in this order in propagation direction D1021 of the acoustic wave. IDT electrode 116 includes comb-shaped electrodes 116a and 116b facing each other to interdigitate with each other. Comb-shaped electrode 116a includes bus bar 126a extending in propagation direction D1021 and electrode fingers 136a extending in direction D1022 perpendicular to propagation direction D1021 from bus bar 126a toward bus bar 126b of comb-shaped electrode 116b. Comb-shaped electrode 116b includes bus bar 126b extending in propagation direction D1021 and electrode fingers 136b extending in direction D1022 from bus bar 126b toward bus bar 126a of comb-shaped electrode 116a. Electrode fingers 136a and electrode fingers 136b are alternately arranged at predetermined pitches in propagation direction D1021. IDT electrode 117 includes comb-shaped electrodes 117a and 117b facing each other to interdigitate with each other. Comb-shaped electrode 117a includes bus bar 127a extending in propagation direction D1021 and electrode fingers 137a extending in direction D1022 from bus bar 127a toward bus bar 127b of comb-shaped electrode 117b. Comb-shaped electrode 117b includes bus bar 127b extending in propagation direction D1021 and electrode fingers 137b extending in direction D1022 from bus bar 127b toward bus bar 127a of comb-shaped electrode 117a. Electrode fingers 137a and electrode fingers 137b are arranged alternately at the above pitches in propagation direction D1021. IDT electrode 118 has comb-shaped electrodes 118a and 118b facing each other and interdigitating with each other. Comb-shaped electrode 118a includes bus bar 128a extending in propagation direction D1021 and electrode fingers 138a extending in direction D1022 from bus bar 128a toward bus bar 128b of comb-shaped electrode 118b. Comb-shaped electrode 118b includes bus bar 128b extending in propagation direction D1021 and electrode fingers 138b extending in direction D1022 from bus bar 128b toward bus bar 128a of comb-shaped electrode 118a. Electrode fingers 138a and electrode fingers 138b are arranged alternately at the above pitches in propagation direction D1021. IDT electrode 119 includes comb-shaped electrodes 119a and 119b facing each other to interdigitate with each other. Comb-shaped electrode 119a includes bus bar 129a extending in propagation direction D1021 and electrode fingers 139a extending in direction D1022 from bus bar 129a toward bus bar 129b of comb-shaped electrode 119b. Comb-shaped electrode 119b includes bus bar 129b extending in propagation direction D1021 and electrode fingers 139b extending in direction D1022 from bus bar 129b toward bus bar 129a of comb-shaped electrode 119a. Electrode fingers 139a and electrode fingers 139b are arranged alternately at the above pitches in propagation direction D1021. IDT electrode 120 includes comb-shaped electrodes 120a and 120b facing each other to interdigitate with each other. Comb-shaped electrode 120a includes bus bar 130a extending in propagation direction D1021 and electrode fingers 140a extending in direction D1022 from bus bar 130a toward bus bar 130b of comb-shaped electrode 120b. Comb-shaped electrode 120b includes bus bar 130b extending in propagation direction D1021 and electrode fingers 140b extending in direction D1022 from bus bar 130b toward bus bar 130a of comb-shaped electrode 120a. Electrode fingers 140a and electrode fingers 140b are arranged alternately at the above pitches in propagation direction D1021. Each of the above pitches is a distance between centers of two electrode fingers adjacent to each other in propagation direction D1021, and is a half of a wavelength of the acoustic wave that propagates through IDT electrodes 116 to 120. Comb-shaped electrode 116a of IDT electrode 116, comb-shaped electrode 118a of IDT electrode 118 and comb-shaped electrode 120a of IDT electrode 120 are connected to input port 102a. Comb-shaped electrode 116b of IDT electrode 116, comb-shaped electrode 118b of IDT electrode 118 and comb-shaped electrode 120b of IDT electrode 120 are grounded. Comb-shaped electrode 117a of IDT electrode 117 and comb-shaped electrode 119a of IDT electrode 119 are connected to output port 102b. Comb-shaped electrode 117b of IDT electrode 117 and comb-shaped electrode 119b of IDT electrode 119 are grounded. Two grounded electrode fingers in total, one grounded electrode finger 136b and one grounded electrode finger 137b are located between the electrode fingers of comb-shaped electrode 116a of IDT electrode 116 connected to input port 102a and comb-shaped electrode 117a of IDT electrode 117 connected to output port 102b closest to each other. Regarding all of the relations between IDT electrodes 117 and 118, between IDT electrodes 119 and 118, and between IDT electrodes 119 and 120, two grounded electrode fingers are located between two electrode fingers that are connected to the hot terminals and are closest to each other, and a phase relation between the comb-shaped electrodes of the IDT electrodes adjacent to each other is an anti-phase relation, similarly to IDT electrodes 15 to 18 shown in FIGS. 2C and 2D.

In propagation direction D1021, a distance between a center of one or any one electrode finger 136a out of electrode fingers 136a of IDT electrode 116 and a center of one or any one electrode finger 137a out of electrode fingers 137a of IDT electrode 117 adjacent to IDT electrode 116 is equal to the sum of an integer multiple and a half of a wavelength of the acoustic wave that propagates through IDT electrodes 116 to 120. A distance in propagation direction D1021 between a center of one or any one electrode finger 137a out of electrode fingers 137a of IDT electrode 117 and a center of one or any one electrode finger 138a out of electrode fingers 138a of IDT electrode 118 adjacent to IDT electrode 117 is equal to the sum of an integer multiple and a half of the wavelength of the acoustic wave that propagates through IDT electrodes 116 to 120. A distance in propagation direction D1021 between a center of one or any one electrode finger 138a out of electrode fingers 138a of IDT electrode 118 and a center of one or any one electrode finger 139a out of electrode fingers 139a of IDT electrode 119 that adjoins IDT electrode 118 is equal to the sum of an integer multiple and a half of the wavelength of the acoustic wave that propagates through IDT electrodes 116 to 120. A distance in propagation direction D1021 between a center of one or any one electrode finger 139a out of electrode fingers 139a of IDT electrode 119 and a center of one or any one electrode finger 140a out of electrode fingers 140a of IDT electrode 120 adjacent to IDT electrode 119 is equal to the sum of an integer multiple and a half of the wavelength of the acoustic wave that propagates through IDT electrodes 116 to 120.

In the case that the electrode fingers of IDT electrodes 116 to 120 are arranged entirely at the above pitches in propagation direction D1021, the number of electrode fingers out of electrode fingers 136b and 137b of IDT electrodes 116 and 117 adjacent to each other in propagation direction D1021 that are located between electrode finger 136a closest to comb-shaped electrode 117a among electrode fingers 136a and electrode finger 137a closest to comb-shaped electrode 116a among electrode fingers 137a is zero or an even number not smaller than two. In this case, the number of electrode fingers out of electrode fingers 137b and 138b of IDT electrodes 117 and 118 adjacent to each other in propagation direction D1021 that are located between electrode finger 137a closest to comb-shaped electrode 118a among electrode fingers 137a and electrode finger 138a closest to comb-shaped electrode 117a among electrode fingers 138a is zero or an even number not smaller than two. In this case, the number of electrode fingers out of electrode fingers 138b and 139b of IDT electrodes 118 and 119 adjacent to each other in propagation direction D1021 that are located between electrode finger 138a closest to comb-shaped electrode 119a among electrode fingers 138a and electrode finger 139a closest to comb-shaped electrode 118a among electrode fingers 139a is zero or an even number not smaller than two.

In this case, the number of electrode fingers out of electrode fingers 139b and 140b of IDT electrodes 119 and 120 adjacent to each other in propagation direction D 1021 that are located between electrode finger 139a closest to comb-shaped electrode 120a among electrode fingers 139a and electrode finger 140a closest to comb-shaped electrode 119a among electrode fingers 140a is zero or an even number not smaller than two.

Output port 101b of longitudinally-coupled acoustic wave filter 101 is electrically connected to input port 102a of longitudinally-coupled acoustic wave filter 102 in a series connection. This structure in which the longitudinally-coupled acoustic wave filter having in-phase relation between comb-shaped electrodes of adjoining IDT electrodes is connected in series to a longitudinally-coupled acoustic wave filter having anti-phase relation between comb-shaped electrodes of adjoining IDT electrodes increases impedance in a stopband higher than a pass band. This provides a filtering performance of excellent attenuation characteristic while maintaining a small insertion loss in the pass band, thereby providing a filter having outstanding attenuation characteristic especially in a frequency band higher than the pass band.

Acoustic wave device 100 may further include one-port resonator 103 having input port 103a connected to output port 101b of longitudinally-coupled acoustic wave filter 101, and output port 103b connected to input port 102a of longitudinally-coupled acoustic wave filter 102, such that output port 101b of longitudinally-coupled acoustic wave filter 101 and input port 102a of longitudinally-coupled acoustic wave filter 102 can be connected in series via one-port resonator 103. Thus, input port 102a of longitudinally-coupled acoustic wave filter 102 is coupled with output port 101b of longitudinally-coupled acoustic wave filter 101 via one-port resonator 103. One-port resonator 103 includes reflectors 155 and 156 and IDT electrode 150 disposed between reflectors 155 and 156. IDT electrode 150 includes comb-shaped electrode 150a connected to input port 103a, and comb-shaped electrode 150b connected to output port 103b, Comb-shaped electrode 150b faces and interdigitates with comb-shaped electrode 150a. An anti-resonance frequency of one-port resonator 103 is higher than the pass band. One-port resonator 103 may further increase an attenuation amount in a frequency band higher than the pass band, and has a high impedance at the anti-resonance frequency, hence improving the attenuation characteristic.

Figure 3:
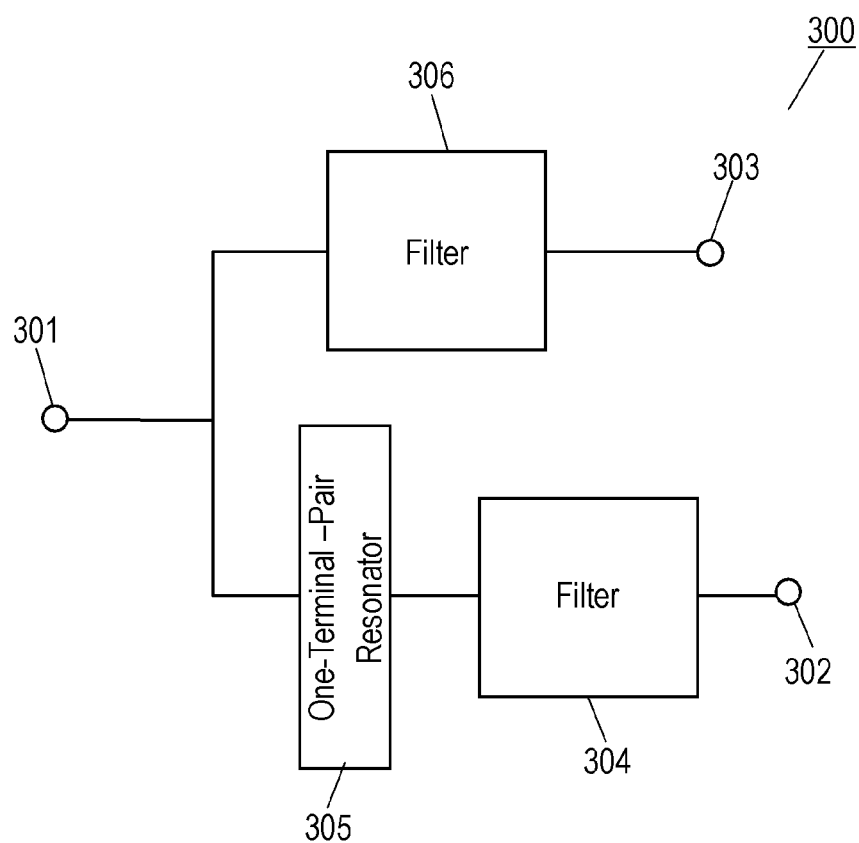
FIG. 3 is a circuit diagram of an antenna duplexer according to Embodiment 1.

FIG. 3 is a circuit diagram of antenna duplexer 300 according to Embodiment 1. Antenna duplexer 300 includes antenna terminal 301, output terminal 302, input terminal 303, filters 304 and 306, and one-port resonator 305. Filter 306 for transmitting is connected between antenna terminal 301 and input terminal 303. Filter 304 for receiving is connected between antenna terminal 301 and output terminal 302. One-port resonator 305 is connected in series between antenna terminal 301 and filter 304 for receiving. Filter 304 for receiving employs acoustic wave device 100 shown in FIG. 1. To be specific, input port 101a of longitudinally-coupled acoustic wave filter 101 shown in FIG. 1 is coupled to antenna terminal 301 via input terminal 100a of acoustic wave device 100 and one-port resonator 305. Output port 102b of longitudinally-coupled acoustic wave filter 102 is connected to output terminal 302 via output terminal 100b of acoustic wave device 100. Output port 101b of longitudinally-coupled acoustic wave filter 101 is connected in series to input port 102a of longitudinally-coupled acoustic wave filter 102 via one-port resonator 103. Filter 304 allows a signal of a receiving frequency band to pass through filter 304. Filter 306 allows a signal of a transmitting frequency band higher than the receiving frequency band to pass through filter 306. The lowest frequency in the transmitting frequency band is higher than the highest frequency of the receiving frequency band.

Figure 4:
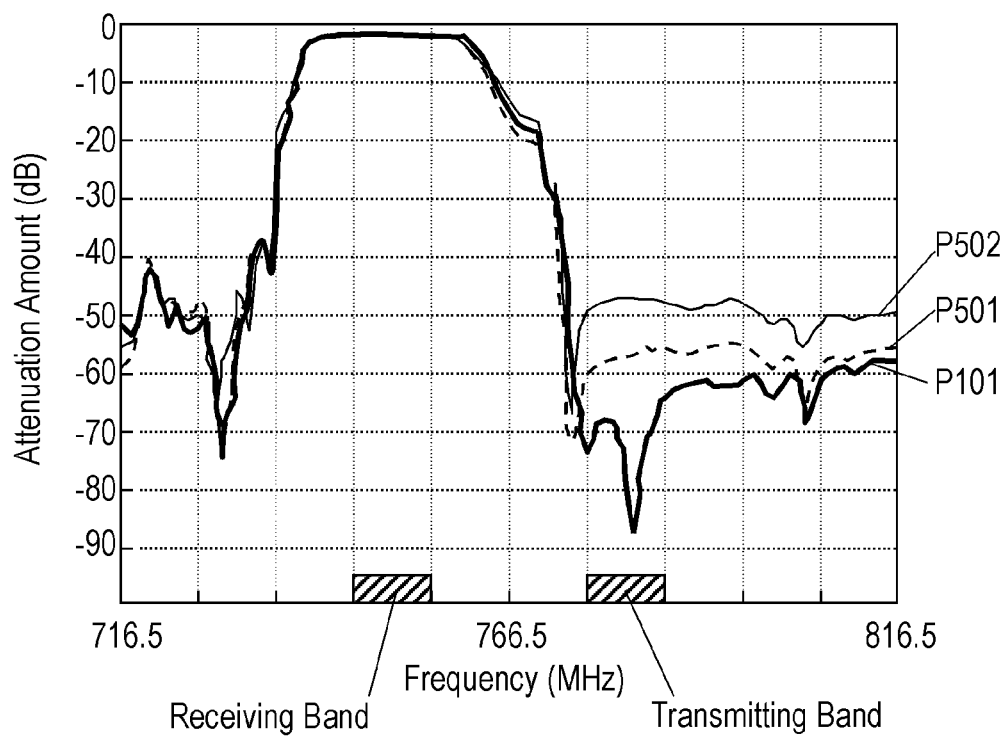
FIG. 4 shows a characteristic of the acoustic wave device according to Embodiment 1.

FIG. 4 shows propagation characteristic P101 of filter 304 for receiving of antenna duplexer 300 of Example 1 according to Embodiment 1, adapted to, for example, Band 13 (i.e., a receiving band ranging from 746.6 MHz to 755.6 MHz and a transmitting band ranging from 777.6 MHz to 786.6 MHz) of Universal Mobile Telecommunications System ("UMTS"). In FIG. 4, the horizontal axis represents a frequency and the vertical axis represents an attenuation amount, i.e., the propagation characteristic. FIG. 4 further shows two propagation characteristics P501 and P502 of filters for receiving of Comparative Examples 1 and 2 of antenna duplexers, respectively. Both filters for receiving of Comparative Examples 1 and 2 of the antenna duplexers have structures similar to acoustic wave device 100 of Example 1 shown in FIG. 1 in which two longitudinally-coupled acoustic wave filters are connected in series via a one-port resonator, except only for a difference in phase relation between IDT electrodes of the longitudinally-coupled acoustic wave filters adjacent to each other from that of Example 1. Table 1 shows phase relations of IDT electrodes of the longitudinally-coupled acoustic wave filters adjacent to each other used in filters for receiving of Example 1 and Comparative Examples 1 and 2. Example 1 and Comparative Examples 1 and 2 have identical structures except the phase relations.

TABLE 1

| | Longitudinally-Coupled Acoustic Wave Filter 101 | Longitudinally-Coupled Acoustic Wave Filter 101 |
|---|---|---|
| Example 1 | In-Phase Relation | Anti-Phase Relation |
| Comparative Example 1 | Anti-Phase Relation | Anti-Phase Relation |
| Comparative Example 2 | In-Phase Relation | In-Phase Relation |

As shown in FIG. 4, the filter for receiving of Example 1 has an attenuation amount of 64 dB in the transmitting band. On the other hand, the filter for receiving of Comparative Example 1 has an attenuation amount of 55 dB in the transmitting band, and the filter for receiving of Comparative Example 2 has an attenuation amount of 47 dB in the transmitting band. Thus, the phase relation between IDT electrodes of longitudinally-coupled acoustic wave filter 101 adjacent to each other is an in-phase relation while the phase relation between IDT electrodes of longitudinally-coupled acoustic wave filter 102 adjacent to each other is an anti-phase relation. This arrangement provides a large attenuation amount in the transmitting band, or the stopband, thus providing an excellent attenuation characteristic. The filter for receiving of Example 1 does not increase an insertion loss thereof in the receiving band, or the pass band.

Optimum phase relations of IDT electrodes use as filter 304 for receiving of antenna duplexer 300 are studied. Table 2 shows phase relations of IDT electrodes of the longitudinally-coupled acoustic wave filters used in the filters for receiving of Examples 1 and 2.

TABLE 2

|  | Longitudinally-Coupled Acoustic Wave Filter 101 | Longitudinally-Coupled Acoustic Wave Filter 101 |
| --- | --- | --- |
| Example 1 | In-Phase Relation | Anti-Phase Relation |
| Example 2 | Anti-Phase Relation | In-Phase Relation |

As shown in Table 2, filter 304 for receiving of Example 1 is configured such that the phase relation of the adjacent IDT electrodes of longitudinally-coupled acoustic wave filter 101 closer to antenna terminal 301 is an in-phase relation, and the phase relation of the adjacent IDT electrodes of longitudinally-coupled acoustic wave filter 102 closer to output terminal 302 is an anti-phase relation. The filter for receiving of Example 2 is configured such that the phase relation of the adjacent IDT electrodes of longitudinally-coupled acoustic wave filter 101 closer to antenna terminal 301 is an anti-phase relation while the phase relation of the adjacent IDT electrodes of longitudinally-coupled acoustic wave filter 102 closer to output terminal 302 is an in-phase relation. Examples 1 and 2 have identical structures except for the phase relations.

Figure 5:
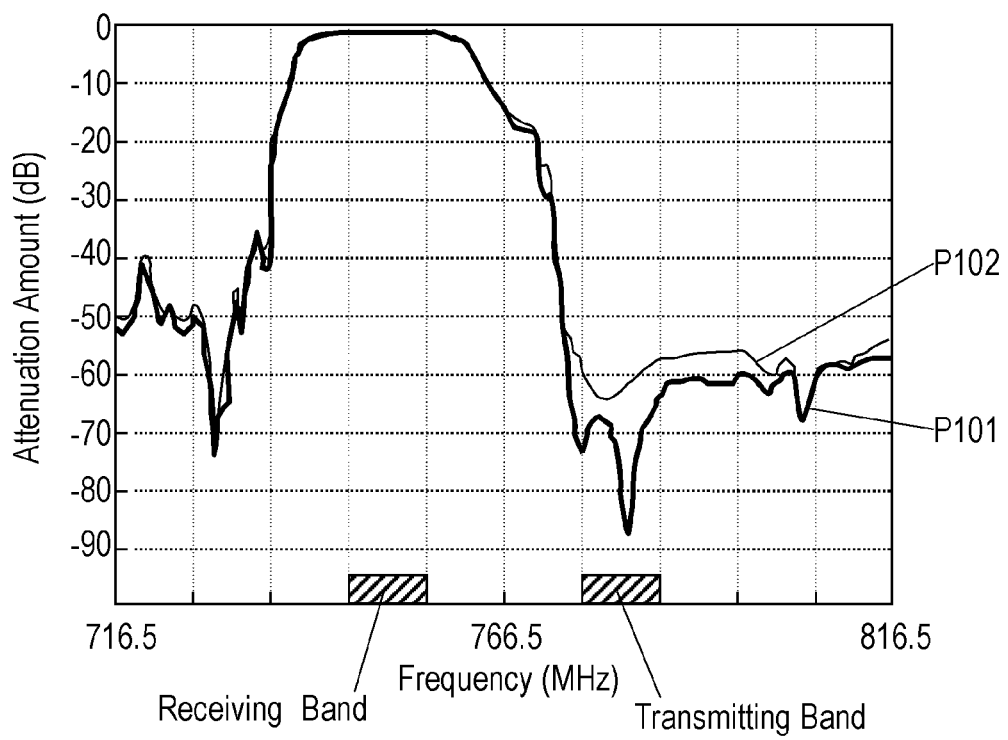
FIG. 5 shows a characteristic of the acoustic wave device according to Embodiment 1.

FIG. 5 shows propagation characteristics P101 and P102 of filters 304 for receiving of antenna duplexers 300 of Examples 1 and 2, respectively. In FIG. 5, the horizontal axis represents a frequency and the vertical axis represents an attenuation amount, or the propagation characteristic. Filter 304 for receiving of Example 1 has an attenuation amount of 64 dB in the transmitting band, or the stopband. On the other hand, filter 304 for receiving of Example 2 has an attenuation amount of 57 dB in the transmitting band. Thus, the phase relation between the adjacent IDT electrodes of longitudinally-coupled acoustic wave filter 101 closer to antenna terminal 301 is an in-phase relation, and the phase relation between the adjacent IDT electrodes of longitudinally-coupled acoustic wave filter 102 closer to output terminal 302 in an anti-phase relation. This arrangement provides a large attenuation amount in the stopband, thus providing an excellent attenuation characteristic.

Exemplary Embodiment 2

Figure 6:
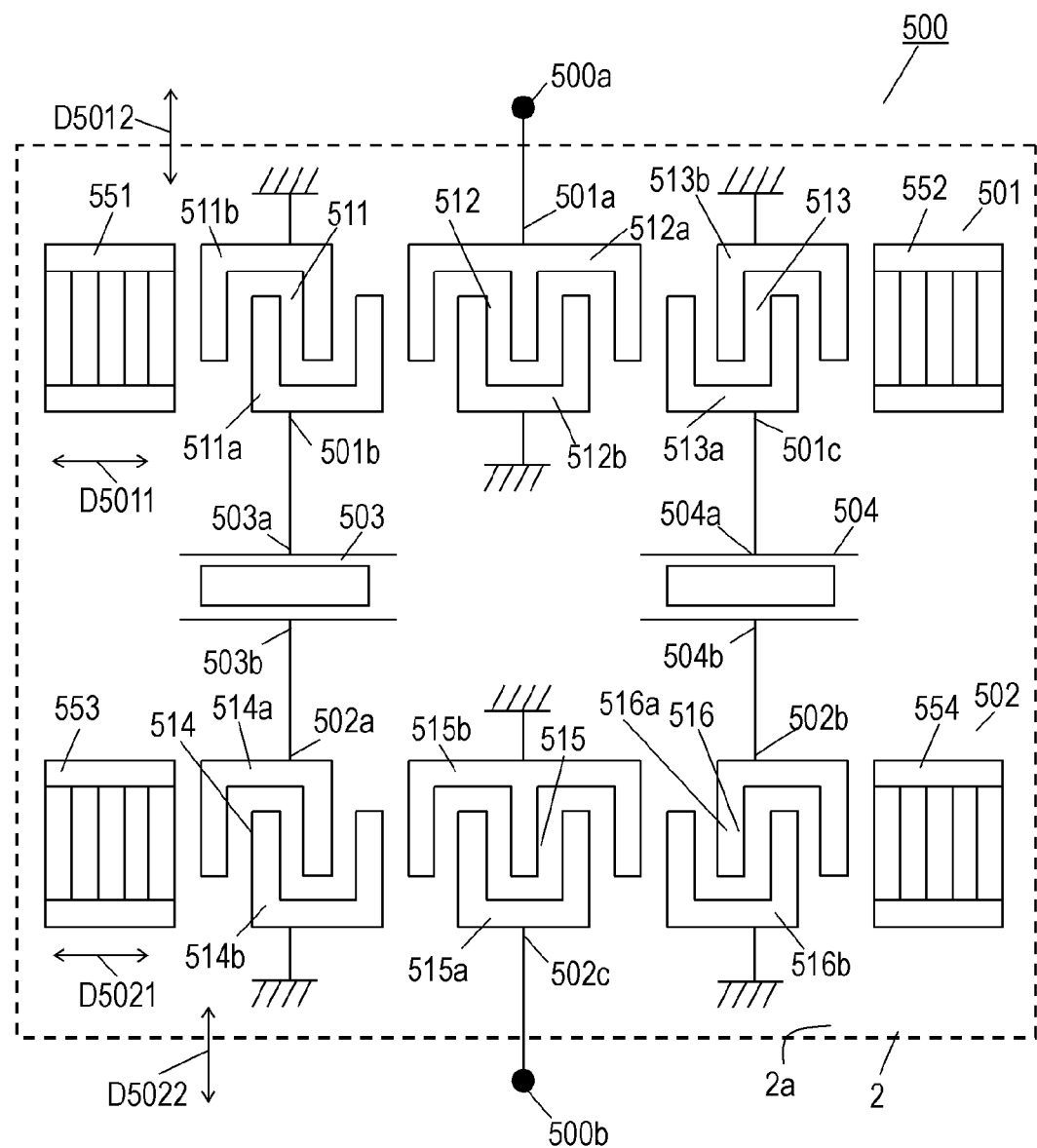
FIG. 6 is a schematic diagram of an acoustic wave device according to Exemplary Embodiment 2 of the present invention.

FIG. 6 is a schematic diagram of acoustic wave device 500 according to Exemplary Embodiment 2 of the present invention. In FIG. 6, components identical to those of the device according to Embodiment 1 shown in FIG. 1 are denoted by the same reference numerals. Acoustic wave device 500 includes input terminal 500a, output terminal 500b, longitudinally-coupled acoustic wave filter 501 connected to input terminal 500a, longitudinally-coupled acoustic wave filter 502 connected to output terminal 500b, and one-port resonators 503 and 504 connected between longitudinally-coupled acoustic wave filters 501 and 502. Longitudinally-coupled acoustic wave filters 501 and 502 and one-port resonators 503 and 504 are disposed on surface 2a of piezoelectric substrate 2 made of a piezoelectric material, such as lithium niobate or lithium tantalite, allowing acoustic waves, such as a Rayleigh wave and a shear horizontal ("SH") wave, to propagate through the substrate.

Longitudinally-coupled acoustic wave filter 501 includes input port 501a connected to input terminal 500a, output ports 501b and 501c, reflectors 551 and 552, and three interdigital transducer ("IDT") electrodes 511, 512 and 513 disposed between reflectors 551 and 552. An acoustic wave excited by at least one IDT electrode (512) of IDT electrodes 511 to 513 propagates through IDT electrodes 511 to 513 between reflectors 551 and 552 in propagation direction D5011. IDT electrodes 511, 512 and 513 are arranged in this order in propagation direction D5011. IDT electrode 513 is arranged opposite to IDT electrode 512 with respect to IDT electrode 511 such that the acoustic wave propagates through the IDT electrodes. IDT electrode 511 includes comb-shaped electrodes 511a and 511b facing each other to interdigitate with each other. Comb-shaped electrode 511a includes a bus bar extending in propagation direction D5011 and electrode fingers extending in direction D5012 perpendicular to propagation direction D5011 from the bus bar of comb-shaped electrode 511a toward a bus bar of comb-shaped electrode 511b. Comb-shaped electrode 511b includes the bus bar extending in propagation direction D5011 and electrode fingers extending in direction D50 12 from the bus bar of comb-shaped electrode 511b toward the bus bar of comb-shaped electrode 511a. The electrode fingers of comb-shaped electrodes 511a and 511b are arranged alternately at predetermined pitches in propagation direction D5011. IDT electrode 512 includes comb-shaped electrodes 512a and 512b facing each other to interdigitate with each other. Comb-shaped electrode 512a includes a bus bar extending in propagation direction D50 11 and electrode fingers extending in direction D5012 from the bus bar comb-shaped electrode 512a toward a bus bar of comb-shaped electrode 512b. Comb-shaped electrode 512b includes the bus bar extending in propagation direction D5011 and electrode fingers extending in direction D50 12 from the bus bar of comb-shaped electrode 512b toward the bus bar of comb-shaped electrode 512a. The Electrode fingers of comb-shaped electrodes 512a and 512b are arranged alternately at the predetermined pitches in propagation direction D5011. IDT electrode 513 includes comb-shaped electrodes 513a and 513b facing each other to interdigitate with each other. Comb-shaped electrode 513a includes a bus bar extending in propagation direction D5011 and electrode fingers extending in direction D5012 from the bus bar of comb-shaped electrode 513a toward a bus bar of comb-shaped electrode 513b. Comb-shaped electrode 513b includes the bus bar extending in propagation direction D5011 and electrode fingers extending in direction D5012 from the bus bar comb-shaped electrode 513b toward the bus bar of comb-shaped electrode 513a. The electrode fingers of comb-shaped electrodes 513a and 513b are arranged alternately at the predetermined pitches in propagation direction D5011. Each of the above pitches is a distance between centers of two electrode fingers adjacent to each other in propagation direction D5011, and is a half of a wavelength of the acoustic wave that propagates through IDT electrodes 511 to 513. Input port 501*a* and output ports 501*b* and 501*c* are hot terminals having electrical potentials change. Comb-shaped electrode 512*a* of IDT electrode 512 is connected to input port 501*a*. Comb-shaped electrode 511*a* of IDT electrode 511 is connected to output port 501*b*. Comb-shaped electrode 513*a* of IDT electrode 513 is connected to output port 501*c*. Comb-shaped electrodes 511*b*, 512*b* and 513*b* of IDT electrodes 511, 512 and 513 are grounded, so that electrical potentials of comb-shaped electrodes 511*b*, 512*b* and 513*b* do not change.

Longitudinally-coupled acoustic wave filter 502 includes input ports 502*a* and 502*b*, output port 502*c* connected to output terminal 500*b*, reflectors 553 and 554, and three IDT electrodes 514, 515 and 516 disposed between reflectors 553 and 554. An acoustic wave excited by at least one IDT electrode (514 and 516) of IDT electrodes 514 to 516 propagates through IDT electrodes 514 to 516 between reflectors 553 and 554 in propagation direction D5021. IDT electrodes 514, 515 and 516 are arranged in this order in propagation direction D5021. IDT electrode 516 is arranged opposite to IDT electrode 514 with respect to IDT electrode 515 such that the acoustic wave propagates through the IDT electrodes. IDT electrode 514 includes comb-shaped electrodes 514*a* and 514*b* facing each other to interdigitate with each other. Comb-shaped electrode 514*a* includes a bus bar extending in propagation direction D5021 and electrode fingers extending in direction D5022 perpendicular to propagation direction D5021 from the bus bar of comb-shaped electrode 514*a* toward a bus bar of comb-shaped electrode 514*b*. Comb-shaped electrode 514*b* includes the bus bar extending in propagation direction D5021 and electrode fingers extending in direction D5022 from the bus bar of comb-shaped electrode 514*b* toward the bus bar of comb-shaped electrode 514*a*. The electrode fingers of comb-shaped electrodes 514*a* and 514*b* are arranged alternately at predetermined pitches in propagation direction D5021. IDT electrode 515 includes comb-shaped electrodes 515*a* and 515*b* facing each other to interdigitate with each other. Comb-shaped electrode 515*a* includes a bus bar extending in propagation direction D5021 and electrode fingers extending in direction D5022 from the bus bar of comb-shaped electrode 515*a* toward a bus bar of comb-shaped electrode 515*b*. Comb-shaped electrode 515*b* includes a bus bar extending in propagation direction D5021 and electrode fingers extending in direction D5022 from the bus bar of comb-shaped electrode 515*b* toward the bus bar of comb-shaped electrode 515*a*. The electrode fingers of comb-shaped electrodes 515*a* and 515*b* are arranged alternately at the predetermined pitches in propagation direction D5021. IDT electrode 516 includes comb-shaped electrodes 516*a* and 516*b* facing each other to interdigitate with each other. Comb-shaped electrode 516*a* includes a bus bar extending in propagation direction D5021 and electrode fingers extending in direction D5022 from the bus bar of comb-shaped electrode 516*a* toward a bus bar of comb-shaped electrode 516*b*. Comb-shaped electrode 516*b* includes a bus bar extending in propagation direction D5021 and electrode fingers extending in direction D5022 from the bus bar of comb-shaped electrode 516*b* toward the bus bar of comb-shaped electrode 516*a*. The electrode fingers of comb-shaped electrodes 516*a* and 516*b* are arranged alternately at the predetermined pitches in propagation direction D5021. Each of the above pitches is a distance between centers of two electrode fingers adjacent to each other in propagation direction D5021, and is a half of a wavelength of the acoustic wave that propagates through IDT electrodes 514 to 516. Input ports 502*a* and 502*b* and output port 502*c* are hot terminals having electrical potentials change. Comb-shaped electrode 514*a* of IDT electrode 514 is connected to input port 502*a*. Comb-shaped electrode 516*a* of IDT electrode 516 is connected to input port 502*b*. Comb-shaped electrode 515*a* of IDT electrode 515 is connected to output port 502*c*. Comb-shaped electrodes 514*b*, 515*b* and 516*b* of IDT electrodes 514, 515 and 516 are grounded so that electrical potentials of the comb-shaped electrodes 514, 515 and 516 do not change.

Output ports 501*b* and 501*c* of longitudinally-coupled acoustic wave filter 501 are connected electrically to input ports 502*a* and 502*b* of longitudinally-coupled acoustic wave filter 502, respectively, and thus, filters 502 and 503 are connected in series.

One-port resonator 503 has input port 503*a* connected to output port 501*b* of longitudinally-coupled acoustic wave filter 501, and output port 503*b* connected to input port 502*a* of longitudinally-coupled acoustic wave filter 502, such that output port 501*b* of longitudinally-coupled acoustic wave filter 501 is connected in series to input port 502*a* of longitudinally-coupled acoustic wave filter 502 via one-port resonator 503. Thus, input port 502*a* of longitudinally-coupled acoustic wave filter 502 is coupled with output port 501*b* of longitudinally-coupled acoustic wave filter 501 via one-port resonator 503. One-port resonator 504 has input port 504*a* connected to output port 501*c* of longitudinally-coupled acoustic wave filter 501, and output port 504*b* connected to input port 502*c* of longitudinally-coupled acoustic wave filter 502, such that output port 501*c* of longitudinally-coupled acoustic wave filter 501 is connected in series to input port 502*c* of longitudinally-coupled acoustic wave filter 502 via one-port resonator 504. Thus, input port 502*b* of longitudinally-coupled acoustic wave filter 502 is coupled with output port 501*c* of longitudinally-coupled acoustic wave filter 501 via one-port resonator 504. One-port resonator 503 includes two reflectors and an IDT electrode disposed between the reflectors, similarly to one-port resonator 103 according to Embodiment 1 shown in FIG. 1. The IDT electrode includes a comb-shaped electrode connected to input port 503*a* and another comb-shaped electrode connected to output port 503*b*. These comb-shaped electrodes face each other to interdigitate with each other. Similar to one-port resonator 503, one-port resonator 504 includes two reflectors and one IDT electrode disposed between the two reflectors. The IDT electrode includes a comb-shaped electrode connected to input port 504*a* and another comb-shaped electrode connected to output port 504*b*. These comb-shaped electrodes face each other to interdigitate with each other. Anti-resonance frequencies of one-port resonators 503 and 504 are higher than a pass band. One-port resonators 503 and 504 have high impedances at the anti-resonance frequencies and can increase an attenuation amount in a frequency band higher than the pass band, hence improving the attenuation characteristic.

Input ports 501*a*, 502*a* and 502*b*, and output ports 501*b*, 501*c* and 502*c* are hot terminals having electrical potentials change. Samples having various phase relations among comb-shaped electrodes 511*a* to 516*a* of IDT electrode 511 to 516 connected to the hot terminals are prepared. Table 3 shows phase relations among the IDT electrodes of the samples of Examples 3 and 4 and Comparative Examples 3 and 4. In these samples, arrangements of in-phase relations and anti-phase relations of the comb-shaped electrodes of the IDT electrodes are same as those in-phase relations and anti-phase relations of the device according to Embodiment 1 shown in FIGS. 2A to 2D, respectively. All of Examples 3 and 4 and Comparative Examples 3 and 4 have the same structure except the phase relations.

TABLE 3

| | Longitudinally-Coupled Acoustic Wave Filter 101 | | Longitudinally-Coupled Acoustic Wave Filter 101 | |
|---|---|---|---|---|
| | IDT Electrodes 511 and 512 | IDT Electrodes 512 and 513 | IDT Electrodes 514 and 515 | IDT Electrodes 515 and 516 |
| Example 3 | In-Phase Relation | In-Phase Relation | Anti-Phase Relation | Anti-Phase Relation |
| Example 4 | In-Phase Relation | Anti-Phase Relation | Anti-Phase Relation | In-Phase Relation |
| Comparative Example 3 | In-Phase Relation | In-Phase Relation | In-Phase Relation | In-Phase Relation |
| Comparative Example 4 | Anti-Phase Relation | Anti-Phase Relation | Anti-Phase Relation | Anti-Phase Relation |

As shown in Table 3, in Examples 3 and 4, longitudinally-coupled acoustic wave filter 501 connected to input terminal 500a includes IDT electrodes 511 and 512 including comb-shaped electrodes 511a and 512a connected to the hot terminals and arranged in an in-phase relation, and longitudinally-coupled acoustic wave filter 502 connected to output terminal 500b includes IDT electrodes 514 and 515 including comb-shaped electrodes 514a and 515a connected to the hot terminals and arranged in an anti-phase relation.

Figure 7:
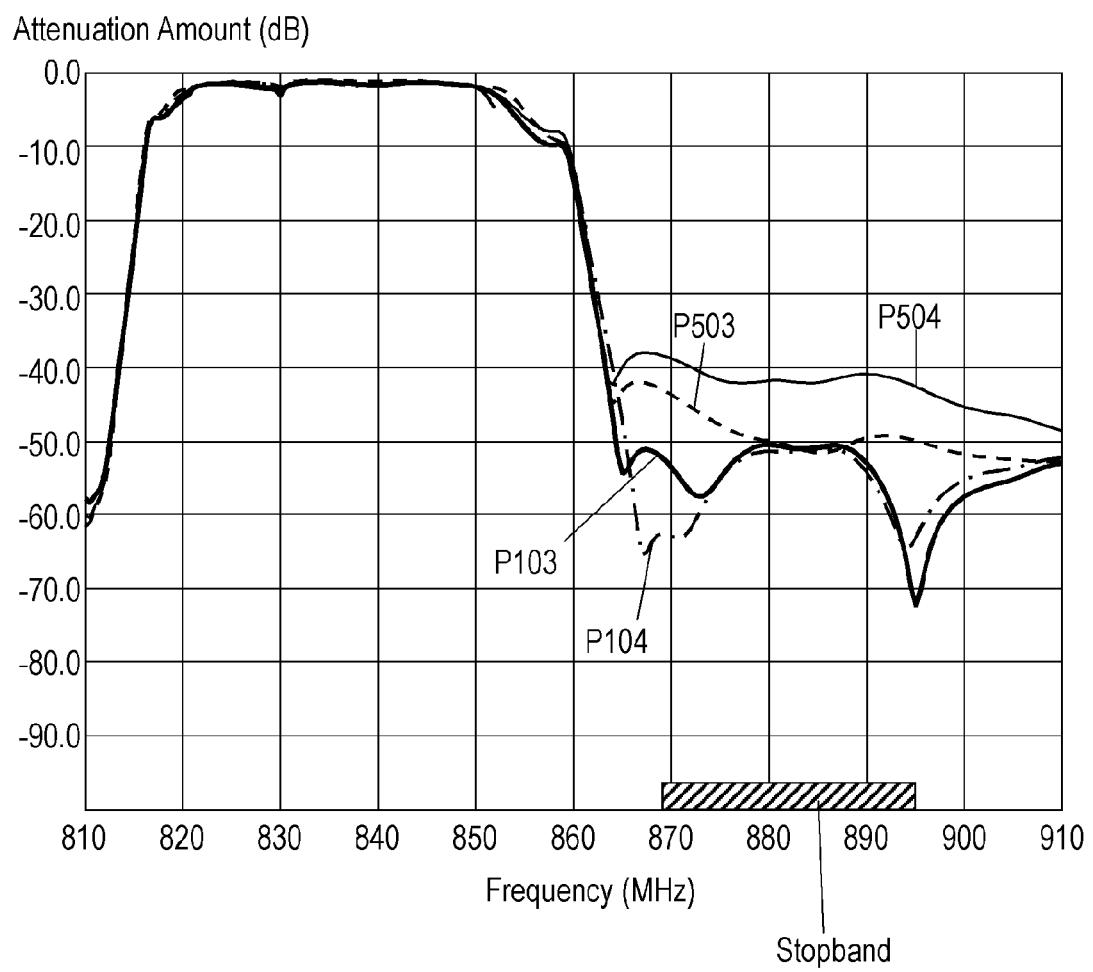
FIG. 7 shows a characteristic of the acoustic wave device according to Embodiment 2.
Figure 8:
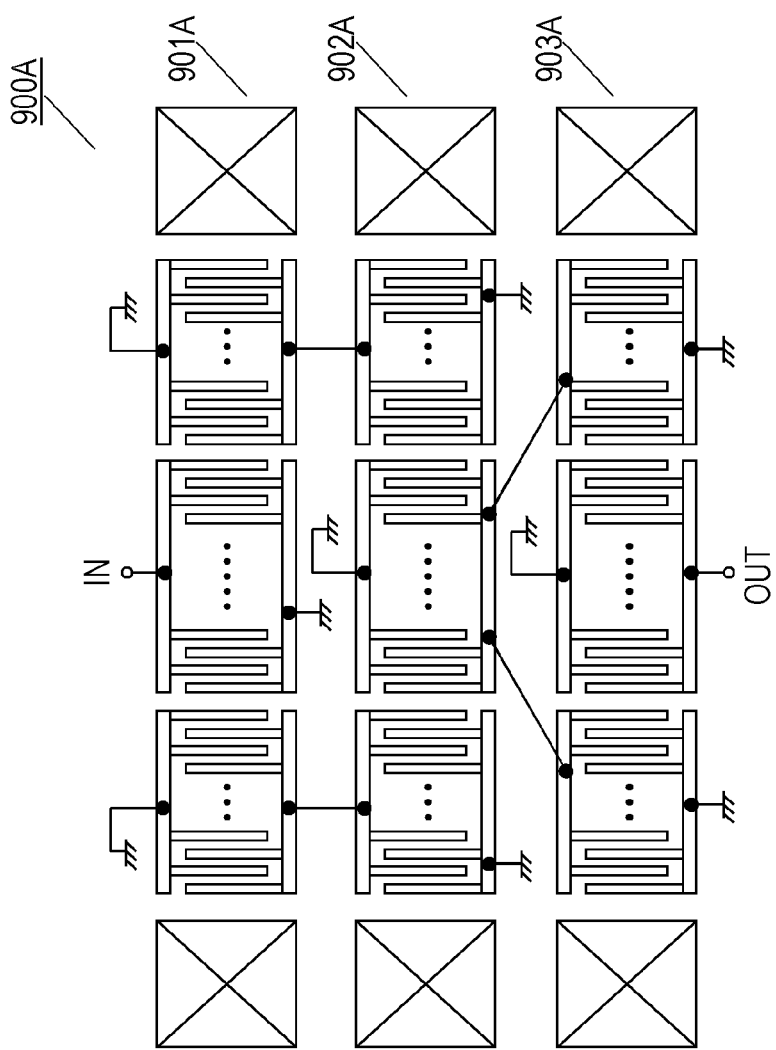
FIG. 8 is a schematic diagram of a conventional acoustic wave device.
Figure 9:
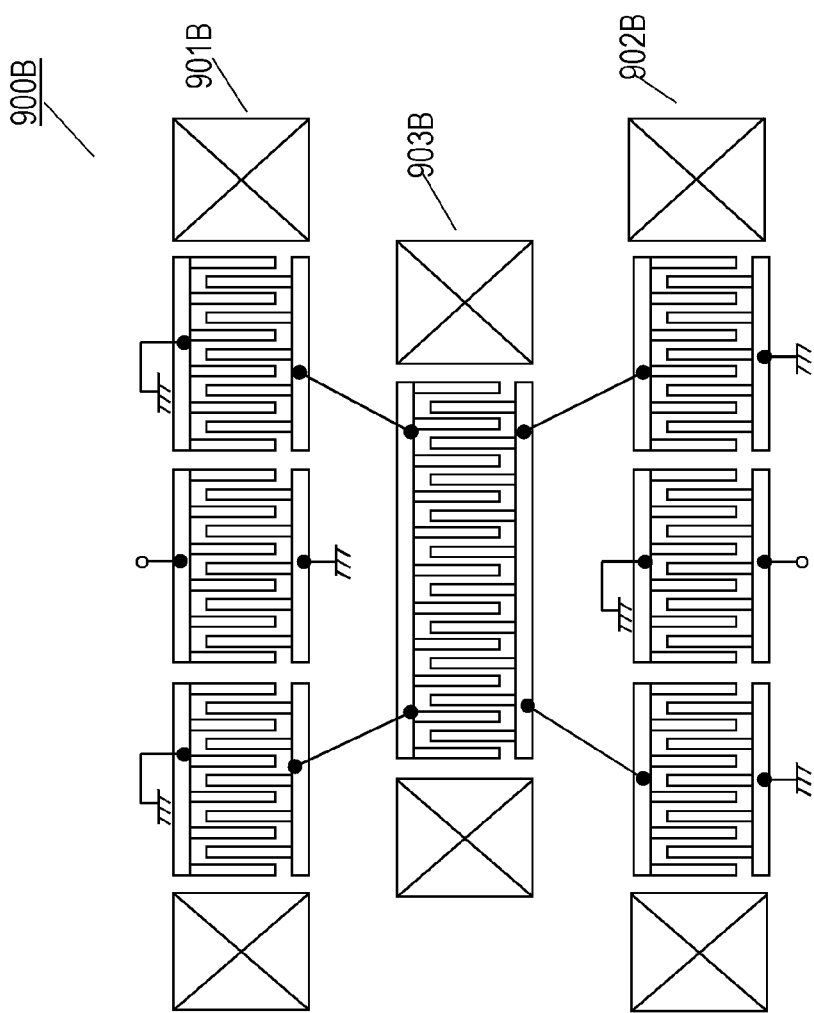
FIG. 9 is a schematic diagram of another conventional acoustic wave device.
Figure 10:
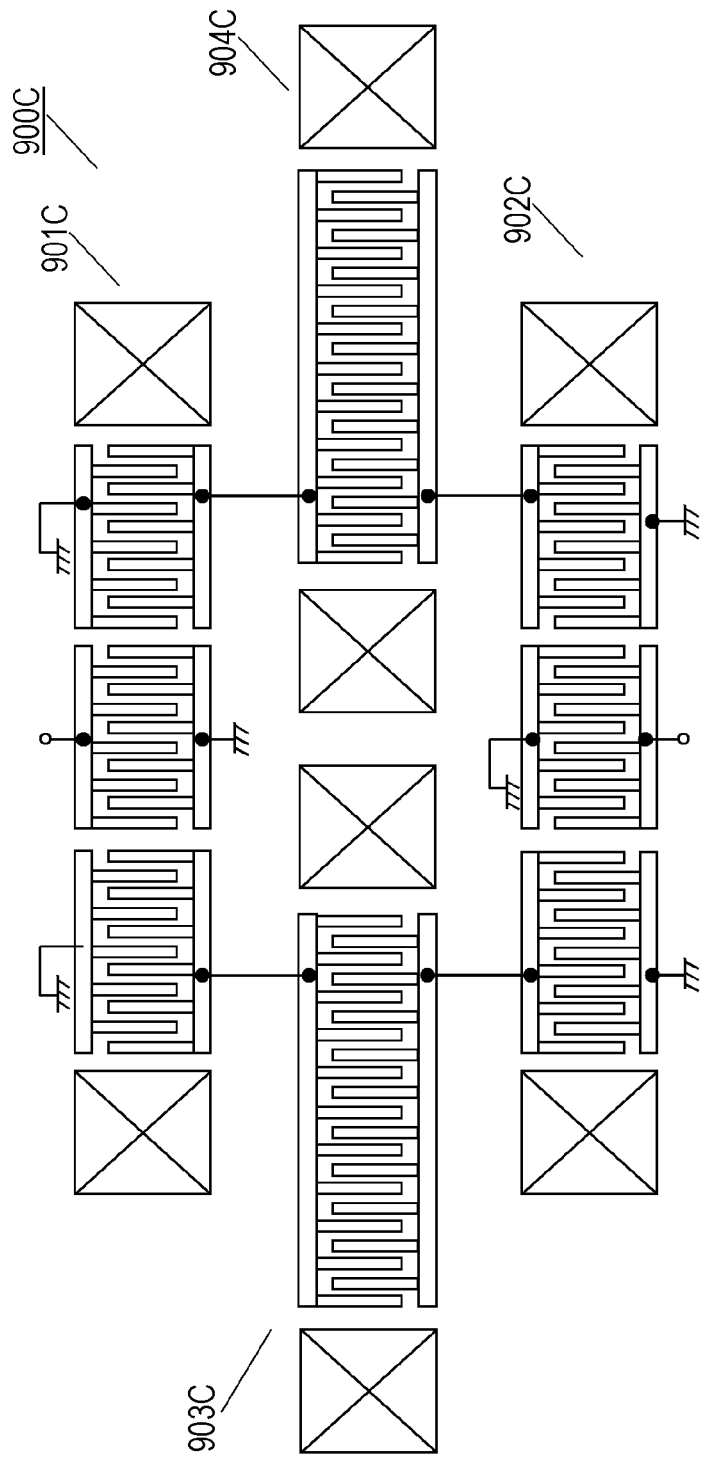
FIG. 10 is a schematic diagram of still another conventional acoustic wave device.

FIG. 7 shows propagation characteristics P103 and P104 of Examples 3 and 4 and propagation characteristics P503 and P504 of Comparative Examples 3 and 4, respectively, used as filter 304 for receiving of antenna duplexer 300. In FIG. 76, the horizontal axis represents a frequency and the vertical axis represents an attenuation amount. As shown in FIG. 7, Examples 3 and 4 have larger attenuation amounts than Comparative Examples 3 and 4 in the stopband. Acoustic wave device 500 of Example 3 or 4 according to Embodiment 2 used as filter 304 for receiving of antenna duplexer 300 shown in FIG. 3 can provide a large attenuation amount in the stopband than an antenna duplexer that uses any of Comparative Examples 3 and 4, hence providing an excellent attenuation characteristic. Example 4 has a larger attenuation amount than Example 3 in the stopband. Acoustic wave device 500 of Example 4 according to Embodiment 2 used as filter 304 for receiving of antenna duplexer 300 shown in FIG. 3 has a larger attenuation amount in the stopband than antenna duplexer 300 that uses Example 3, thus providing a more preferable attenuation characteristic.

What is claimed is:

1. An acoustic wave device comprising:
a first longitudinally-coupled acoustic wave filter including a first input port, a first output port, a second output port, a first interdigital transducer (IDT) electrode having a first comb-shaped electrode connected to the first input port, a second IDT electrode having a second comb-shaped electrode connected to the first output port, and a third IDT electrode having a third comb-shaped electrode connected to the second output port, the first longitudinally-coupled acoustic wave filter being configured to excite and propagate a first acoustic wave in a first propagation direction, the first IDT electrode being positioned between the second and third IDT electrodes along the first propagation direction, and the first and second comb-shaped electrodes being in an in-phase relation;
a second longitudinally-coupled acoustic wave filter including a second input port, a third output port, a third input port, a fourth IDT electrode having a fourth comb-shaped electrode connected to the second input port, a fifth IDT electrode having a fifth comb-shaped electrode connected to the third output port, and a sixth IDT electrode having a sixth comb-shaped electrode connected to the third input port, the second longitudinally-coupled acoustic wave filter configured to excite and propagate a second acoustic wave in a second propagation direction, the fourth IDT electrode being positioned between the fifth and sixth IDT electrodes along the second propagation direction, and the fourth and fifth comb-shaped electrodes being in an anti-phase relation;
a first one-port resonator connected between the first output port of the first longitudinally-coupled acoustic wave filter and the second input port of the second longitudinally-coupled acoustic wave filter; and
a second one-port resonator connected between the second output port of the first longitudinally-coupled acoustic wave filter and the third input port of the second longitudinally-coupled acoustic wave filter.

2. The acoustic wave device of claim 1 wherein the first comb-shaped electrode includes a plurality of first electrode fingers, the second comb-shaped electrode includes a plurality of second electrode fingers, and a distance between a center of any one first electrode finger of the plurality of first electrode fingers and a center of any one second electrode finger of the plurality of second electrode fingers in the first propagation direction is an integer multiple of a wavelength of the first acoustic wave.

3. The acoustic wave device of claim 2 wherein the fourth comb-shaped electrode includes a plurality of fourth electrode fingers, the fifth comb-shaped electrode includes a plurality of fifth electrode fingers, and a distance between a center of any one fourth electrode finger of the plurality of fourth electrode and a center of any one fifth electrode finger of the plurality of fifth electrode fingers in the second propagation direction is a sum of an integer multiple and a half of a wavelength of the second acoustic wave.

4. The acoustic wave device of claim 3 wherein the third comb-shaped electrode includes a plurality of third electrode fingers, and a distance between a center of any one first electrode finger of the plurality of first electrode fingers and a center of any one third electrode finger of the plurality of third electrode fingers along the first propagation direction is a sum of an integer multiple and a half of the wavelength of the first acoustic wave.

5. The acoustic wave device of claim 4 wherein the sixth comb-shaped electrode includes a plurality of sixth electrode fingers, and a distance between a center of any one sixth electrode finger of the plurality of sixth electrode fingers and a center of any one fifth electrode finger of the plurality of fifth electrode fingers in the second propagation direction is an integer multiple of the wavelength of the second acoustic wave.

6. The acoustic wave device of claim 5 wherein the first IDT electrode further includes a seventh comb-shaped electrode that is grounded and has a plurality of seventh electrode fingers arranged alternately with the plurality of first electrode fingers in the first propagation direction, the second IDT electrode further includes an eighth comb-shaped electrode that is grounded and has a plurality of eighth electrode fingers arranged alternately with the plurality of second electrode fingers in the first propagation direction, and a number of electrode fingers out of the plurality of seventh electrode fingers and the plurality of eighth electrode fingers that are located between a first electrode finger closest to the second comb-shaped electrode among the plurality of first electrode fingers and a second electrode finger closest to the first comb-shaped electrode among the plurality of second electrode fingers being an odd number.

7. The acoustic wave device of claim 6 wherein the fourth IDT electrode further includes a ninth comb-shaped electrode that is grounded and has a plurality of ninth electrode fingers arranged alternately with the plurality of fourth electrode fingers in the second propagation direction, and the fifth IDT electrode further includes a tenth comb-shaped electrode that is grounded and has a plurality of tenth electrode fingers arranged alternately with the plurality of fifth electrode fingers in the second propagation direction, a number of electrode fingers out of the plurality of ninth electrode fingers and the plurality of tenth electrode fingers that are located between a fourth electrode finger closest to the fifth comb-shaped electrode among the plurality of fourth electrode fingers and a fifth electrode finger closest to the fourth comb-shaped electrode among the plurality of fifth electrode fingers being either zero or an even number.

8. The acoustic wave device of claim 7 wherein the third IDT electrode further includes an eleventh comb-shaped electrode having a plurality of eleventh electrode fingers arranged alternately with the plurality of third electrode fingers in the first propagation direction, a number of electrode fingers out of the plurality of seventh electrode fingers and the plurality of eleventh electrode fingers that are located between a first electrode finger closest to the eleventh comb-shaped electrode among the plurality of first electrode fingers and a third electrode finger closest to the first comb-shaped electrode among the plurality of third electrode fingers being either zero or an even number.

9. The acoustic wave device of claim 8 wherein the sixth IDT electrode further includes a twelfth comb-shaped electrode that is grounded and has a plurality of twelfth electrode fingers arranged alternately with the plurality of sixth electrode fingers in the second propagation direction, a number of electrode fingers out of the plurality of ninth electrode fingers and the plurality of twelfth electrode fingers that are located between a ninth electrode finger closest to the twelfth comb-shaped electrode among the plurality of ninth electrode fingers and an fourth electrode finger closest to the sixth comb-shaped electrode among the plurality of fourth electrode fingers being an odd number.

10. The acoustic wave device of claim 3 wherein the third comb-shaped electrode includes a plurality of third electrode fingers, a distance between a center of one first electrode finger of the plurality of first electrode fingers and a center of one third electrode finger of the plurality of third electrode fingers in the first propagation direction being an integer multiple of the wavelength of the first acoustic wave.

11. The acoustic wave device of claim 10 wherein the sixth comb-shaped electrode includes a plurality of sixth electrode fingers, and a distance between a center of any one sixth electrode finger of the plurality of sixth electrode fingers and a center of any one fifth electrode finger of the plurality of fifth electrode fingers is a sum of an integer multiple and a half of the wavelength of the second acoustic wave.

12. The acoustic wave device of claim 11 wherein a distance between a center of any one fourth electrode finger of the plurality of fourth electrode fingers and a center of any one fifth electrode finger of the plurality of fifth electrode fingers is a sum of an integer multiple and a half of the wavelength of the second acoustic wave.

13. The acoustic wave device of claim 12 wherein a distance between a center of any one first electrode finger of the plurality of first electrode fingers and a center of any one third electrode finger of the plurality of third electrode fingers is an integer multiple of the wavelength of the first acoustic wave, and a distance between a center of any one sixth electrode finger of the plurality of sixth electrode fingers and a center of any one fifth electrode finger of the plurality of fifth electrode fingers is a sum of an integer multiple and a half of the wavelength of the second acoustic wave.

14. The acoustic wave device of claim 1 wherein the first IDT electrode and the third IDT electrode are disposed such that phases of the first comb-shaped electrode and the third comb-shaped electrode are in an anti-phase relation, and the fourth IDT electrode and the sixth IDT electrode are disposed such that phases of the fourth comb-shaped electrode and the sixth comb-shaped electrode are in an in-phase relation.

15. The acoustic wave device of claim 1 wherein the first IDT electrode and the third IDT electrode are disposed such that phases of the first comb-shaped electrode and the third comb-shaped electrode are in an in-phase relation, and the fourth IDT electrode and the sixth IDT electrode are disposed such that phases of the fourth comb-shaped electrode and the sixth comb-shaped electrode are in an anti-phase relation.

16. An antenna duplexer comprising:
a first filter configured to pass a signal in a first frequency band, the first filter including the acoustic wave device of claim 1; and
a second filter configured to pass a signal in a second frequency band higher than the first frequency band.

17. The antenna duplexer of claim 16 further comprising:
an input terminal; and
an output terminal, the first filter being connected between the output terminal and the input terminal, and the second filter being connected between the input terminal and the first filter.

18. An acoustic wave device comprising:
a first longitudinally-coupled acoustic wave filter configured to excite and propagate a first acoustic wave in a first propagation direction and including a first input port, a first output port, and a first plurality of interdigital transducer (IDT) electrodes each having a signal comb-shaped electrode and a grounded comb-shaped electrode that interdigitate with one another, the first plurality of IDT electrodes being arranged along the first propagation direction such that the signal comb-shaped electrodes of sequentially alternating ones of the first plurality of IDT electrodes are connected to the first input port and the first output port, respectively, and adjacent IDT electrodes in the first plurality of IDT electrodes have an in-phase relation;
a second longitudinally-coupled acoustic wave filter configured to excite and propagate a second acoustic wave in a second propagation direction and including a second input port, a second output port, and a second plurality of IDT electrodes each having a signal comb-shaped electrode and a grounded comb-shaped electrode that interdigitate with one another, the second plurality of IDT electrodes being arranged along the second propagation direction such that the signal comb-shaped electrodes of sequentially alternating ones of the second plurality of IDT electrodes are connected to the second input port and the second output port, respectively, and adjacent IDT electrodes in the first plurality of IDT electrodes have an anti-phase relation; and a one-port resonator connected between the first output port of the first longitudinally-coupled acoustic wave filter and the second input port of the second longitudinally-coupled acoustic wave filter.

19. The acoustic wave device of claim 18 wherein the first plurality of IDT electrodes includes five IDT electrodes, and the signal comb-shaped electrode of a center IDT electrode of the first plurality of IDT electrodes is connected to the first output port.

20. The acoustic wave device of claim 19 wherein the second plurality of IDT electrodes includes five IDT electrodes, and the signal comb-shaped electrode of a center IDT electrode of the second plurality of IDT electrodes is connected to the second input port.

* * * * *